United States Patent
Kawamata et al.

(10) Patent No.: US 8,710,619 B2
(45) Date of Patent: Apr. 29, 2014

(54) SEMICONDUCTOR DEVICE AND MANUFACTURING METHOD THEREOF

(75) Inventors: Tatsuya Kawamata, Kanagawa (JP); Atsushi Tachigami, Kanagawa (JP); Kazuya Horie, Kanagawa (JP); Tatsuya Shiromoto, Kanagawa (JP); Tetsuya Nitta, Kanagawa (JP); Hironori Shimizu, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 67 days.

(21) Appl. No.: 13/208,273

(22) Filed: Aug. 11, 2011

(65) Prior Publication Data
US 2012/0049318 A1    Mar. 1, 2012

(30) Foreign Application Priority Data

Aug. 30, 2010  (JP) .................................. 2010-191743

(51) Int. Cl.
*H01L 21/70* (2006.01)
(52) U.S. Cl.
USPC ....... 257/510; 257/347; 257/508; 257/E29.02
(58) Field of Classification Search
USPC .............................. 257/347, 508, 510, E29.02
See application file for complete search history.

(56) References Cited

U.S. PATENT DOCUMENTS

| 7,868,412 | B2 | 1/2011 | Okamoto | |
|---|---|---|---|---|
| 2002/0001965 | A1* | 1/2002 | Forbes | 438/734 |
| 2002/0025654 | A1* | 2/2002 | Arita et al. | 438/424 |
| 2002/0102815 | A1* | 8/2002 | Hashimoto et al. | 438/435 |
| 2007/0148906 | A1* | 6/2007 | Kim | 438/424 |
| 2007/0264819 | A1 | 11/2007 | Offenberg et al. | |
| 2008/0305644 | A1 | 12/2008 | Noda et al. | |

FOREIGN PATENT DOCUMENTS

| JP | 11-40666 A | 2/1999 |
|---|---|---|
| JP | 2000-150807 A | 5/2000 |
| JP | 2002-43413 A | 2/2002 |
| JP | 2006-049828 | 2/2006 |
| JP | 2006-269551 | 10/2006 |
| JP | 2007-110119 A | 4/2007 |
| JP | 2008-60383 A | 3/2008 |
| JP | 2008-306003 A | 12/2008 |
| JP | 2009-99815 A | 5/2009 |
| JP | 2009-518838 A | 5/2009 |
| JP | 2009-224660 | 10/2009 |
| WO | WO 2007/065946 A1 | 6/2007 |

OTHER PUBLICATIONS

Issued Office Action Dated Feb. 18, 2014 for Japanese Application No. 2010-191743, with English language translation.

\* cited by examiner

*Primary Examiner* — Tan N Tran
(74) *Attorney, Agent, or Firm* — Miles & Stockbridge P.C.

(57) ABSTRACT

To provide, in a semiconductor device formed on an SOI substrate and having a semiconductor layer of the SOI substrate surrounded, at the periphery of the element region thereof, with element isolation, a technology capable of preventing reliability deterioration attributed to the element isolation. Appearance of a hollow, which is formed upon filling of a deep trench with an insulating film, from the upper surface of the insulating film can be prevented by setting the trench width of the upper portion of the deep trench configuring trench isolation at less than 1.2 µm. Reduction in the breakdown voltage between adjacent element regions which may presumably occur due to a decrease in the trench width of the upper portion of the deep trench can be prevented by forming, on the upper portion of the deep trench, an LOCOS insulating film coupled to the insulating film filled in the deep trench.

1 Claim, 16 Drawing Sheets

4 : DEEP TRENCH
7 : HOLLOW

4 : DEEP TRENCH
7 : HOLLOW

SEMICONDUCTOR DEVICE AND MANUFACTURING METHOD THEREOF

CROSS-REFERENCE TO RELATED APPLICATIONS

The disclosure of Japanese Patent Application No. 2010-191743 filed on Aug. 30, 2010 including the specification, drawings and abstract is incorporated herein by reference in its entirety.

BACKGROUND

The present invention relates to a semiconductor device and a manufacturing technology thereof, in particular, to an element isolation structure for electrically isolating high breakdown voltage semiconductor elements formed on the main surface of an SOI (silicon on isolation) substrate and a technology effective when applied to the manufacture of the structure.

In recent years, trench isolation has been employed in order to electrically isolate two adjacent semiconductor elements provided on the main surface of a semiconductor substrate, because it can provide a surface of almost the same level as that of the main surface of the semiconductor substrate and at the same time, it enables more minute processing than LOCOS (local oxidation of silicon) isolation. Trench isolation is formed by forming a trench in the main surface of a semiconductor substrate and then burying an insulating film in the trench.

For example, Japanese Patent Laid-Open No. 2002-43413 (Patent Document 1) discloses a forward tapered trench formed using anisotropic etching at a position near the surface of a semiconductor substrate and another trench, which lies therebelow and is coupled thereto, formed by isotropic etching so that the width of its bottom portion is equal to or greater than the width of the bottom of the forward tapered trench.

Japanese Patent Laid-Open No. 2008-60383 (Patent Document 2) discloses a technology of, after formation of a trench in the surface of a silicon substrate, isotropically etching the inner surface of the trench with radicals in order to clean the inner surface of the trench to remove contaminants therefrom and remove a defect layer on the inner surface of the trench.

Japanese Patent Laid-Open No. 2009-99815 (Patent Document 3) discloses semiconductor device capable of providing a common potential between wells by forming a trench between wells of the same kind, forming a silicide layer at least on the bottom of the trench, and coupling these wells of the same kind at low resistance. The trench is formed by patterning a semiconductor substrate by using anisotropic etching and then widening the opening width by using isotropic etching.

Japanese Patent Laid-Open No. 2008-306003 (Patent Document 4) discloses a technology of forming on a semiconductor substrate a trench having an aspect ratio of 10 or greater by using anisotropic dry etching and then removing a damage layer by isotropic dry etching from the whole wall surface of the trench.

Japanese Patent Laid-Open No. 40666/1999 (Patent Document 5) discloses a technology of forming, between two wirings adjacent to each other, an interlayer insulating film comprised of a silicon oxide film having a pore and a low dielectric constant insulating film formed thereon in order to reduce a capacitance between wirings of the same layer or different layers.

Japanese Patent Laid-Open No. 2007-110119 (Patent Document 6) discloses a technology of forming a first layer of a first insulating substance by using plasma chemical vapor deposition so as to provide a space between two adjacent wirings and after causing the first layer to retreat, depositing a second layer of a second insulating substance on the resulting first layer.

Japanese Patent Laid-Open No. 2000-150807 (Patent Document 7) discloses a technology of suppressing a dishing phenomenon by rounding or tapering the corner of a trench having a substantially polygonal shape to surround therewith an element region.

International Patent Publication No. 2009-518838 (Patent Document 8) discloses the structure of insulating trenches having a uniform insulating trench width obtained by chamfering or rounding the trenches at a cross region or confluent region thereof and placing a center island in the cross region or confluent region to make the width of the insulating trenches in the cross region or confluent region equal to that of the insulating trenches in a region other than the cross region or confluent region.

[Patent Document 1] Japanese Patent Laid-Open No. 2002-43413

[Patent Document 2] Japanese Patent Laid-Open No. 2008-60383

[Patent Document 3] Japanese Patent Laid-Open No. 2009-99815

[Patent Document 4] Japanese Patent Laid-Open No. 2008-306003

[Patent Document 5] Japanese Patent Laid-Open No. 40666/1999

[Patent Document 6] Japanese Patent Laid-Open No. 2007-110119

[Patent Document 7] Japanese Patent Laid-Open No. 2000-150807

[Patent Document 8] International Patent Publication No. 2009-518838

SUMMARY

The present inventors have proceeded with the development of a semiconductor device having a high breakdown voltage semiconductor element which is formed on the main surface of an SOI substrate and requires a breakdown voltage of 20V or greater. This semiconductor device employs for element isolation a dielectric isolation system using an SOI substrate and trench isolation in combination.

In the dielectric isolation system, a high breakdown voltage semiconductor element is formed in an element region of a semiconductor layer configuring an SOI substrate. This element region is surrounded with an insulator configuring the SOI substrate and an insulator filled in a deep trench (groove, isolation groove, U groove, trench) formed in the semiconductor layer configuring the SOI substrate and reaching the insulator configuring the SOI substrate. In other words, high breakdown voltage semiconductor elements are formed in island-like element regions of the semiconductor layer isolated from each other by a dielectric material and configuring the SOI substrate.

Accordingly, this dielectric isolation system has an advantage of heightening the integration degree of a semiconductor device because compared with a pn junction isolation system, it can decrease the insulating isolation distance between high breakdown voltage semiconductor elements adjacent to each other. In addition, the dielectric isolation system can heighten the reliability of a semiconductor device because it can principally remove a parasitic transistor between high breakdown voltage semiconductor elements adjacent to each other, thereby preventing the malfunctions such as latch up.

The dielectric isolation system using an SOI substrate and trench isolation in combination however has various technical problems which will be described below.

First, a formation process of trench isolation investigated by the present inventors prior to completion of the invention will be described briefly.

First, a deep trench reaching an insulator configuring an SOI substrate is formed in a semiconductor layer configuring the SOI substrate by using anisotropic dry etching with a resist pattern as a mask. After removal of the resist pattern, a buried insulating film is then deposited on the upper surface of the semiconductor layer configuring the SOI substrate so as to bury it in the deep trench. This buried insulating film is an insulator having a high covering property such as TEOS (tetra ethyl ortho silicate; $Si(OC_2H_5)_4$) film formed using, for example, plasma CVD (chemical vapor deposition) or the like. Then, the upper surface of this buried insulating film is polished and planarized using, for example, CMP (chemical mechanical polishing). As a result, the deep trench having the buried insulating film filled therein is formed as trench isolation.

In the trench isolation formed by the above-described process, however, the buried insulating film 52 is not completely filled in the deep trench 51 as illustrated in FIGS. 23(a) and (b) and a recess 54 is formed on the upper surface of the buried insulating film 52 or a hollow (void, seam, air gap, space) 53 is formed inside the deep trench 51. This recess 54 on the upper surface of the buried insulating film 52 has a greater depth toward the hollow 53 when the trench width of the deep trench 51 is wide (FIG. 23(b)) than when the trench width of the deep trench 51 is narrow (FIG. 23(a)). Also, this hollow 53 extends to a position nearer to the upper surface of the buried insulating film 52 when the trench width of the deep trench 51 is wide (FIG. 23(b)) than when the trench width of the deep trench 51 is narrow (FIG. 23(a)), in particular, when the trench width is 1.2 µm or greater.

Then, the upper surface of the buried insulating film 52 is polished to the position shown by a dotted line in FIGS. 23(a) and (b) by using for example CMP. When the trench width of the deep trench 51 is narrow (FIG. 23(a)), the recess 54 on the upper surface of the buried insulating film 52 disappears and the upper surface of the buried insulating film 52 becomes flat. When the trench width of the deep trench 51 is wide (FIG. 23(b)), on the other hand, the recess 54 remains on the upper surface of the buried insulating film 52 and as a result of further polishing, the hollow 53 appears.

In the subsequent step, a conductive film is deposited on the upper surface of the buried insulating film 52. When the trench width of the deep trench 51 is wide (FIG. 23(b)), the conductive film is also deposited on the recess 54 on the upper surface of the buried insulating film 52 or the hollow 53 and the conductive film remaining in the recess 54 on the upper surface of the buried insulating film 52 or the hollow 53 may cause inconveniences of the high breakdown voltage semiconductor element such as malfunction, increase in parasitic capacitance, and reduction in breakdown voltage of trench isolation.

The present inventors therefore investigated a decrease in the trench width of the deep trench 51 to less than 1.2 µm in order to prevent formation of the deep recess 54 on the upper surface of the buried insulating film 52 and formation of the hollow 53 extending to a position near the upper surface of the buried insulating film 52. However, a decrease in the trench width of the deep trench 51 to less than 1.2 µm causes a reduction in the breakdown voltage of trench isolation. In particular, a decrease in the trench width of the deep trench 51 to less than 0.7 µm causes a marked reduction in the breakdown voltage of trench isolation.

An object of the invention is to provide, in a semiconductor device which is formed on an SOI substrate and in which a semiconductor layer configuring the SOI substrate is surrounded, at the periphery of the element region thereof, with element isolation, a technology capable of preventing deterioration in the reliability attributed to element isolation.

The above-described and the other objects and novel features of the invention will be apparent herein and accompanying drawings.

An embodiment of a typical invention, among the inventions disclosed by the present application, will next be described briefly.

In this embodiment, there is provided a semiconductor device formed on an SOI substrate comprised of a support substrate, a BOX layer made of an insulator formed on the main surface of the support substrate, and an active layer formed on the upper surface of the BOX layer, having an LOCOS insulating film, in a planar view, annularly surrounding an element region and formed on the upper surface of the active layer, a deep trench, in a planar view, annularly surrounding the element region, formed continuously in a portion of the LOCOS insulating film and an active layer underlying therebelow and reaching the BOX layer, and an insulating film buried in the deep trench and also functioning as an interlayer insulating film covering therewith a semiconductor element formed in the element region, in which the trench width of the deep trench formed in a portion of the LOCOS insulating film is smaller than the trench width of the deep trench formed in the active layer and at the same time, is smaller than 1.2 µm.

In this embodiment, there is also provided a manufacturing method of a semiconductor device including the step of forming a high breakdown voltage semiconductor element on an SOI substrate comprised of a support substrate, a BOX layer made of an insulator formed on the main surface of the support substrate, and an active layer formed on the upper surface of the BOX layer, further including the steps of: forming on the upper surface of the active layer an LOCOS insulating film annularly surrounding an element region therewith in a planar view; forming a semiconductor element on the active layer in the element region; depositing on the upper surface of the active layer a first insulating film covering the semiconductor element therewith; etching the first insulating film, which lies on the LOCOS insulating film and at the same time, in a predetermined region annularly surrounding the element region in a planar view, by using dry etching with a resist pattern as a mask; removing the resist pattern, successively etching the LOCOS insulating film and the active layer by using anisotropic dry etching with the first insulating film as a mask, and forming a deep trench annularly surrounding the element region in a planar view and reaching the BOX layer; etching only the side surface of the deep trench formed in the active layer by using isotropic dry etching; depositing a second insulating film in the deep trench and on the first insulating film; and planarizing the upper surface of the second insulating film.

Advantages available by the embodiment of the typical invention, among the inventions disclosed herein, will next be described briefly.

In a semiconductor device which is formed on an SOI substrate and in which a semiconductor layer configuring the SOI substrate is surrounded, at the periphery of the element region thereof, with element isolation, the invention makes it possible to prevent deterioration in the reliability of the semiconductor device attributed to element isolation.

DETAILED DESCRIPTION

Figure 1:
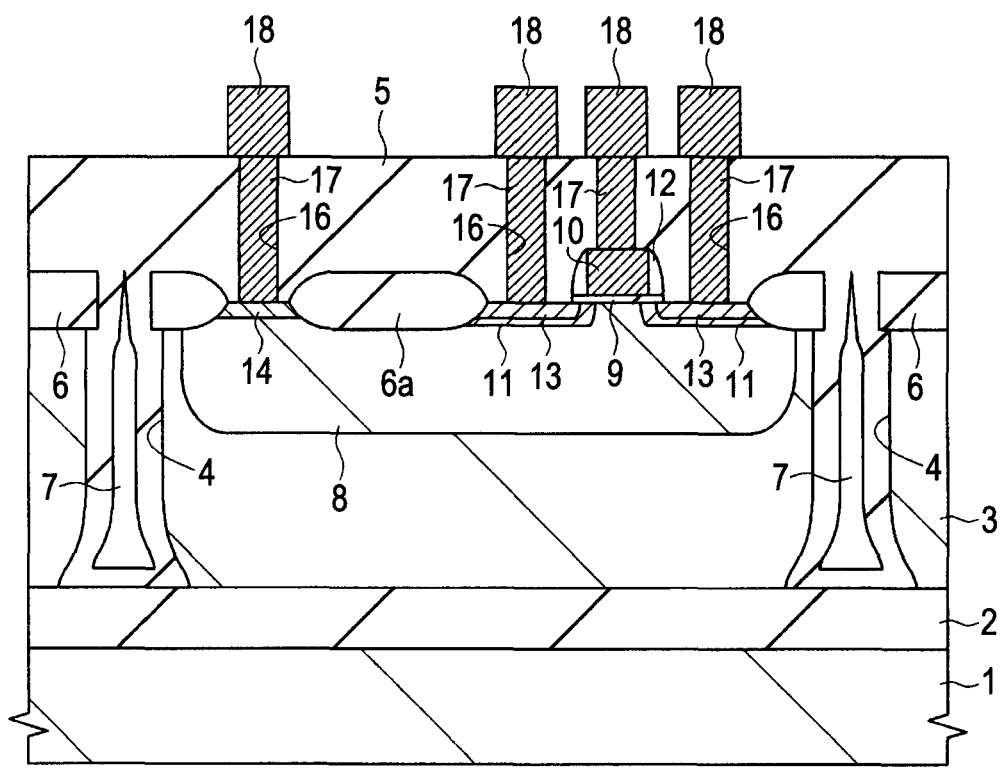
FIG. 1 is a fragmentary cross-sectional view showing a high breakdown voltage semiconductor element formed on an SOI substrate according to a first embodiment of the invention.

In the embodiments described below, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the embodiments described below, when a reference is made to the number of elements (including the number, value, amount, and range), the number is not limited to a specific number but can be greater than or less than the specific number unless otherwise specifically indicated or principally apparent that the number is limited to the specific number. Moreover in the embodiments described below, it is needless to say that the constituent elements (including element steps) are not always essential unless otherwise specifically indicated or principally apparent that they are essential. Similarly, in the embodiments described below, when a reference is made to the shape or positional relationship of the constituent elements, that substantially analogous or similar to it is also embraced unless otherwise specifically indicated or principally apparent that it is not. This also applies to the above-described value and range. Further, in the drawings used in the below-described embodiments, even a plan view may be hatched to facilitate understanding of the drawings. Further, in the embodiments described below, MISFET (metal insulator semiconductor field effect transistor) representing a field effect transistor is abbreviated as MIS, and an n-channel type MIS-FET is abbreviated as nMIS. In addition, the term "wafer" in the embodiments means mainly an SOI (silicon on insulator) wafer and shapes thereof include not only a circle and a nearly circle but also a square, a rectangle and the like.

Further, in all the drawings for describing the embodiments, like members of a function will be identified by like reference numerals and overlapping descriptions will be omitted. The embodiments of the invention will hereinafter be described specifically referring to drawings.

First Embodiment 1

Figure 2:
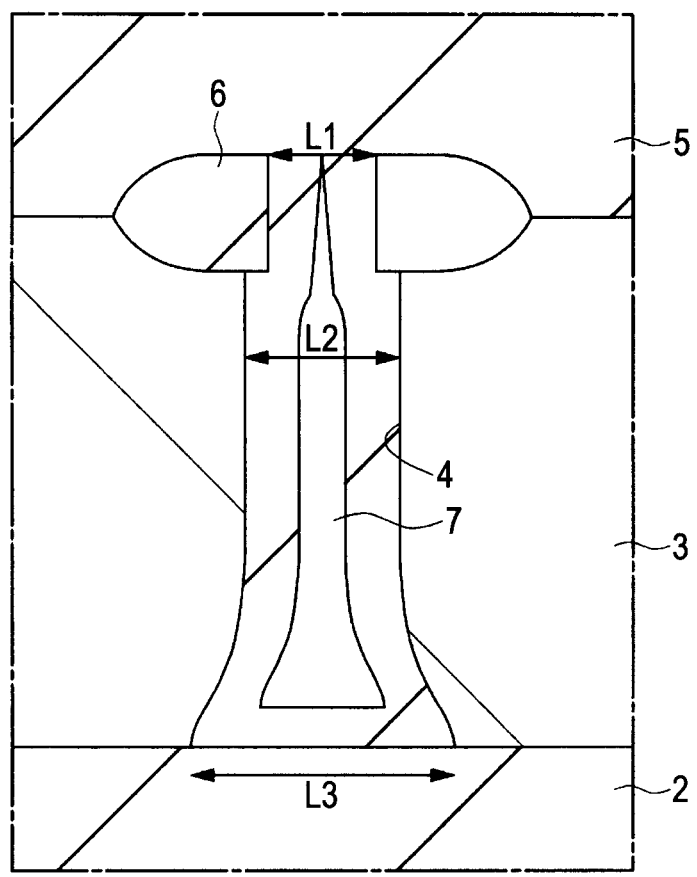
FIG. 2 is an enlarged fragmentary cross-sectional view of the element isolation of FIG. 1.

The structure of a high breakdown voltage semiconductor element formed on an SOI substrate according to the first embodiment is illustrated in FIGS. 1 and 2. FIG. 1 is a fragmentary cross-sectional view showing the high breakdown voltage semiconductor element formed on an SOI substrate and FIG. 2 is an enlarged fragmentary cross-sectional view of the element isolation. A description herein will be made with an n-channel MISFET (which will hereinafter be called "high breakdown voltage nMIS") as the high breakdown voltage semiconductor element.

As illustrated in FIG. 1, the high breakdown voltage nMIS is formed on an SOI substrate. The SOI substrate is comprised of a support substrate 1, a BOX (buried oxide) layer (buried insulating film, insulator) 2 formed on the main surface of the support substrate 1, and an active layer (semiconductor layer) 3 formed on the upper surface of the BOX layer 2. The support substrate 1 is made of single crystal silicon and has a thickness of, for example, about 760 μm. The BOX layer 2 is made of silicon oxide and has a thickness of, for example, about 1.5 μm. The active layer 3 is made of p type single crystal silicon formed using, for example, the epitaxial process and has a thickness of, for example, about 5 μm.

The active layer 3 has, on the upper surface thereof, an LOCOS insulating film 6 that surrounds therewith a predetermined region (element region) in a planar view. This LOCOS insulating film 6 has a width of, for example, 1.2 μm or greater and has a thickness, at the thickest portion thereof, for example, about 0.6 μm. Further, in a portion of the LOCOS insulating film 6 and the active layer 3 lying therebelow, a deep trench (groove, isolation groove, U groove, trench) 4 extends continuously and reaching the BOX layer 2. The deep trench 4 has an insulating film 5 made of, for example, silicon oxide filled therein. The LOCOS insulating film 6 and a portion of the insulating film 5 buried in the deep trench 4 are coupled to each other and configure an integral structure as element isolation.

Accordingly, the active layer 3 which is surrounded with the BOX layer 2, the insulating film 5 buried in the deep trench 4 coupled to the BOX layer 2, and the LOCOS insulating film 6 coupled to the portion of the insulating film 5 buried in the deep trench 4 and formed on the upper surface of the active layer 3 and is therefore in an island form becomes an element region in which a high breakdown voltage nMIS is to be formed. This means that as the element isolation in the first embodiment, a dielectric isolation system using SOI isolation, trench isolation, and LOCOS isolation in combination is employed.

The shape and trench width of the deep trench 4 each differs with the position thereof. For example, the upper portion of the deep trench 4 formed in a portion of the LOCOS insulating film 6 is almost straight but the trench width at this position is narrower than that at another position. The trench width of the middle portion of the deep trench 4 formed continuously in the active layer 3 below the upper portion of the deep trench 4 is wider, for example, by about 0.1 μm than the trench width of the upper portion of the deep trench 4. The deep trench 4 widens toward the bottom thereof. The trench width at a portion brought into contact with the BOX layer 2 is about twice as much as that of the upper portion of the deep trench 4. Such a shape is presumed to appear because upon anisotropic dry etching for forming the deep trench 4, etching ions bounce to the BOX layer 2, scatter, and etch the active layer 3.

For example, as illustrated in FIG. 2, the trench width (first width L1) of the upper portion of the deep trench 4 (a portion formed in a portion of the LOCOS insulating film 6) is for example about 0.7 to 0.8 μm, the trench width (second width L2) of the middle portion of the deep trench 4 (a portion formed between the upper portion and the widening bottom portion of the deep trench 4) is for example about 0.8 to 0.9 μm, and the trench width (third width L3) of the bottom portion of the deep trench 4 (a portion brought into contact with the BOX layer 2 and the widening bottom portion in the vicinity thereof) brought into contact with the BOX layer 2 is for example about 1.6 to 1.8 μm.

The deep trench 4 has an insulating film 5 made of, for example, silicon oxide filled therein, but the deep trench 4 is not completely filled with the insulating film 5 and has therein a hollow (pore, seam, air gap, void) 7. The width of hollow 7 at the lower portion or the middle portion of the deep trench 4 is sometimes about 0.3 μm. The width of the hollow 7 formed in the upper portion of the deep trench 4 is smaller than that of the hollow 7 formed in the lower portion or middle portion of the deep trench 4. The hollow 7 has a tip thereof in the vicinity of the upper surface of the LOCOS insulating film 6. This means that the upper surface of the deep trench 4 is closed with the insulating film 5 and the hollow 7 does not appear from the upper surface of the insulating film 5.

The investigation by the present inventors has revealed that when the trench width of the deep trench 4 becomes smaller than 1.2 μm, the tip of the hollow 7 is located in the vicinity of the upper surface of the LOCOS insulating film 6 and the hollow 7 does not easily exceed the insulating film 5 deposited on the upper surface of the LOCOS insulating film 6. In the first embodiment, the trench width of the upper portion of the deep trench 4 is set at, for example, about 0.7 to 0.8 μm and that of the middle portion is set at, for example, about 0.8 to 0.9 μm so that the tip of the hollow 7 is located in the vicinity of the upper surface of the LOCOS insulating film 6 and the upper surface of the deep trench 4 can be closed with the insulating film 5. As a result, the hollow 7 does not appear from the upper surface of the insulating film 5.

On the other hand, when the width of the deep trench 4 is smaller than 0.7 μm, there is a fear that the breakdown voltage between two adjacent element regions decreases. Since the LOCOS insulating film 6 having a width as great as 1.2 μm or greater is formed above the deep trench 4 having a width of, for example, about 0.7 to 0.8 μm, this LOCOS insulating film 6 can prevent the decrease in the breakdown voltage.

In a portion of the main surface of the active layer 3, an LOCOS insulating film 6a not coupled to the insulating film 5 of the deep trench 4 is formed. This LOCOS insulating film 6a is provided, for example, for defining (surrounding) a power feed region of a well (a p well 8 which will be described later) to be formed in the element region.

The active layer 3 has, in the element region thereof, n type impurities such as phosphorus (P) or arsenic (As) implanted therein and the impurity concentration is, for example, about $1 \times 10^{15}$ cm$^{-3}$. Further, the active layer 3 has, in the element region thereof, a p well 8 which is formed by implanting p type impurities such as boron (B). The p well 8 is also a region serving as a channel region of the high breakdown voltage nMIS.

The high breakdown voltage nMIS is formed in the p well 8 of the element region surrounded with the element isolation (SOI isolation, trench isolation, and LOCOS isolation) of the active layer 3. The active layer 3 (p well 8) has, on the upper surface thereof, a gate insulating film 9 made of, for example, silicon oxide and the gate insulating film has thereon a gate electrode 10 made of, for example, polycrystalline silicon.

The active layer 3 (p well 8) on both sides of the gate electrode 10 is implanted with a low concentration of n type impurities and a pair of n type semiconductor regions 11 is formed in self alignment with the gate electrode 10. The gate electrode 10 has on the side walls thereof sidewalls 12. The active layer 3 (p well 8) on both sides of the sidewalls 12 is implanted with a high concentration of n type impurities and a pair of n type semiconductor regions 13 is formed in self alignment with the sidewalls 12. The n type semiconductor regions 11 and 13 on one side configure a source region of the high breakdown voltage nMIS, while the n type semiconductor region 11 and 13 on the other side configure a drain region of the high breakdown voltage nMIS. This means that the high breakdown voltage nMIS has a source region and a drain region having an LDD (lightly doped drain) structure.

The power feed region of the p well 8 surrounded with the LOCOS insulating films 6 and 6a is implanted with a high concentration of p type impurities to form a p type semiconductor region 14.

Further, the active layer 3 has, on the upper surface thereof, an insulating film 5, which is the same as the insulating film 5 filled in the deep trench 4, in order to cover the high breakdown voltage nMIS. This means that the insulating film 5 has two functions, that is, a function as a buried film in the deep trench 4 and an interlayer insulating film.

The insulating film 5 has therein a gate electrode 10 of the high breakdown voltage nMIS and contact holes 16 reaching the n type semiconductor region 13 of the high breakdown voltage nMIS and the p type semiconductor region 14 formed in the power feed region of the p well 8.

The contact hole 16 has therein a plug 17 made of a conductive substance, for example, a metal such as tungsten (W). The insulating film 5 has thereon a plurality of wirings 18 having, for example, aluminum (Al) as a main conductor. These wirings 18 are electrically coupled via the plug 17 to the gate electrode 10 of the high breakdown voltage nMIS, the n type semiconductor region 13 of the high breakdown voltage nMIS, and the p type semiconductor region 14 formed in the power feed region of the p well 8.

Next, an example of a manufacturing method of the high breakdown voltage semiconductor element formed on an SOI substrate according to the first embodiment will be described in order of steps referring to FIGS. 3 to 11. FIGS. 3 to 11 are fragmentary cross-sectional views showing a high breakdown voltage nMIS formed on the SOI substrate.

Figure 3:
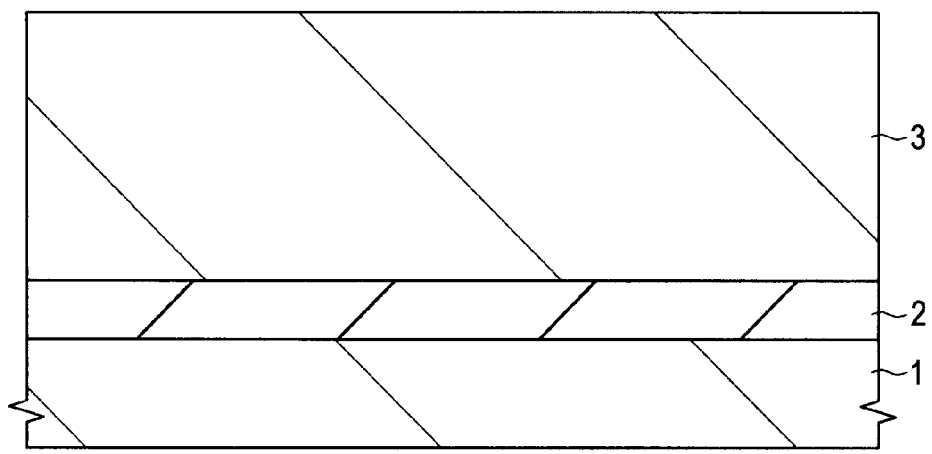
FIG. 3 is a diagram for showing an example of a manufacturing method of a high breakdown voltage semiconductor element formed on an SOI, substrate according to the first embodiment of the invention and it is a fragmentary cross-sectional view of the high breakdown voltage semiconductor element.

First, as illustrated in FIG. 3, an SOI substrate is prepared. The SOI substrate in this stage is made of a member having a substantially disc-shaped surface, which is called "wafer", and is comprised of a support substrate 1, a BOX layer 2 formed on the main surface of the support substrate 1, and an active layer 3 formed on the upper surface of the BOX layer 2. The support substrate 1 is made of single crystal silicon and has a thickness of, for example, about 760 µm and a resistivity of, for example, about 3 to 6 mΩcn. The BOX layer 2 is made of silicon oxide and has a thickness of, for example, about 1.5 µm. The active layer 3 is made of p type single crystal silicon formed, for example, by the epitaxial process and has a thickness of, for example, about 5 µm and a resistivity of, for example, about 18 to 23 Ωcm.

Figure 4:
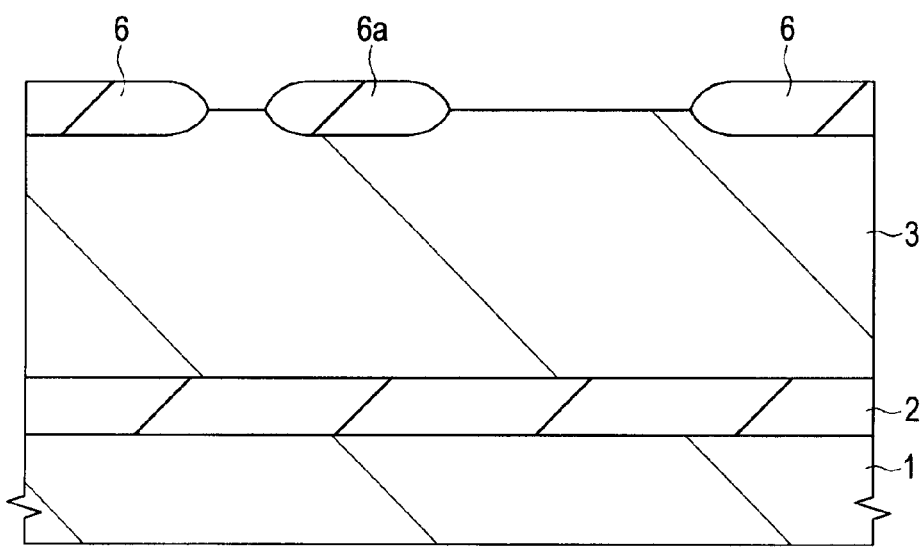
FIG. 4 is a fragmentary cross-sectional view of the same position as that in FIG. 3 during a manufacturing step of the high breakdown voltage semiconductor element following that of FIG. 3.

Next, as illustrated in FIG. 4, LOCOS insulating films 6 and 6a made of silicon oxide are formed in predetermined regions on the upper surface of the active layer 3 by using the LOCOS process for thermally oxidizing a selected area of the active layer 3. The LOCOS insulating film 6 has a width of, for example, about 1.2 µm or greater and has a thickness, at the thickest portion thereof, for example, about 0.6 µm.

Figure 5:
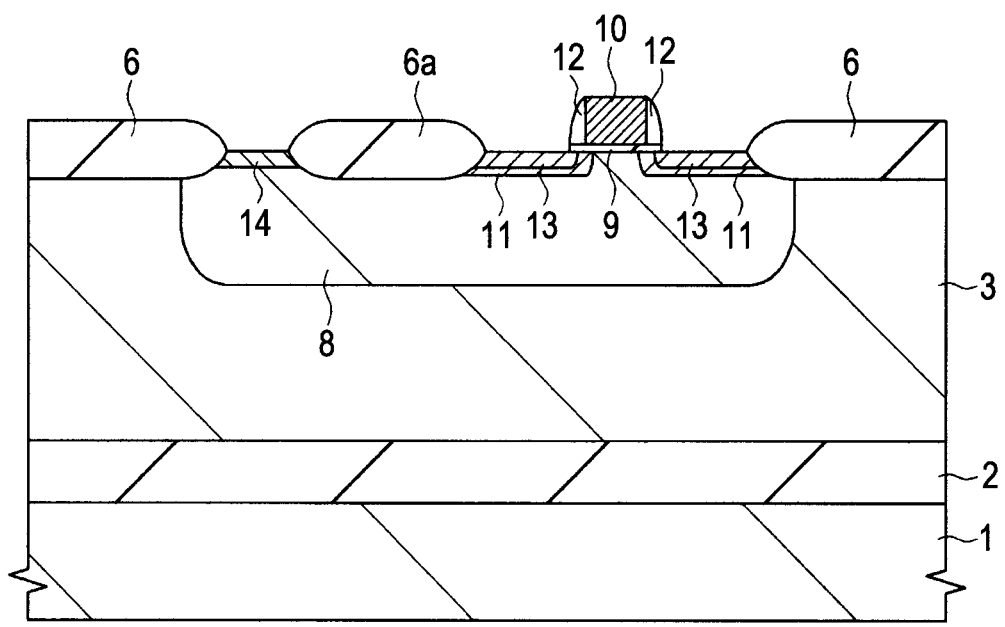
FIG. 5 is a fragmentary cross-sectional view of the same position as that in FIG. 3 during a manufacturing step of the high breakdown voltage semiconductor element following that of FIG. 4.

Next, as illustrated in FIG. 5, a p well 8 is formed by selectively implanting the active layer 3 with p type impurities such as boron (B). After the SOI substrate is subjected to washing treatment, a gate insulating film 9 made of, for example, silicon oxide is then formed on the upper surface of the active layer 3 (p well 8). After formation of a conductor film made of, for example, polycrystalline silicon on the gate insulating film 9, the conductor film is processed by dry etching with a resist pattern as a mask to form a gate electrode 10.

Ion implantation of n type impurities, for example, phosphorus (P) or arsenic (As) into the active layer 3 (p well 8) on both sides of the gate electrode 10 is then performed to form a pair of n type semiconductor regions 11 in self alignment with the gate electrode 10. Then, an insulating film is deposited on the upper surface of the active layer 3 and the resulting insulating film is processed using RIE (reactive ion etching) to form sidewalls 12 on the side walls of the gate electrode 10. Ion implantation of n type impurities, for example, phosphorus (P) or arsenic (As) into the active layer 3 (p well 8) on both sides of the sidewalls 12 is then performed to form a pair of n type semiconductor regions 13 in self alignment with the sidewalls 12. As a result, there are formed a source region having an LDD structure comprised of the n type semiconductor regions 11 and 13 in the active layer 3 (p well 8) on one side of the gate electrode 10 and a drain region having an LDD structure comprised of the n type semiconductor regions 11 and 13 in the active layer 3 (p well 8) on the other side of the gate electrode 10.

Next, a p type semiconductor region 14 is formed by implanting p type impurities, for example, boron (B) into the power feed region of the p well 8 in the active layer 3.

Figure 6:
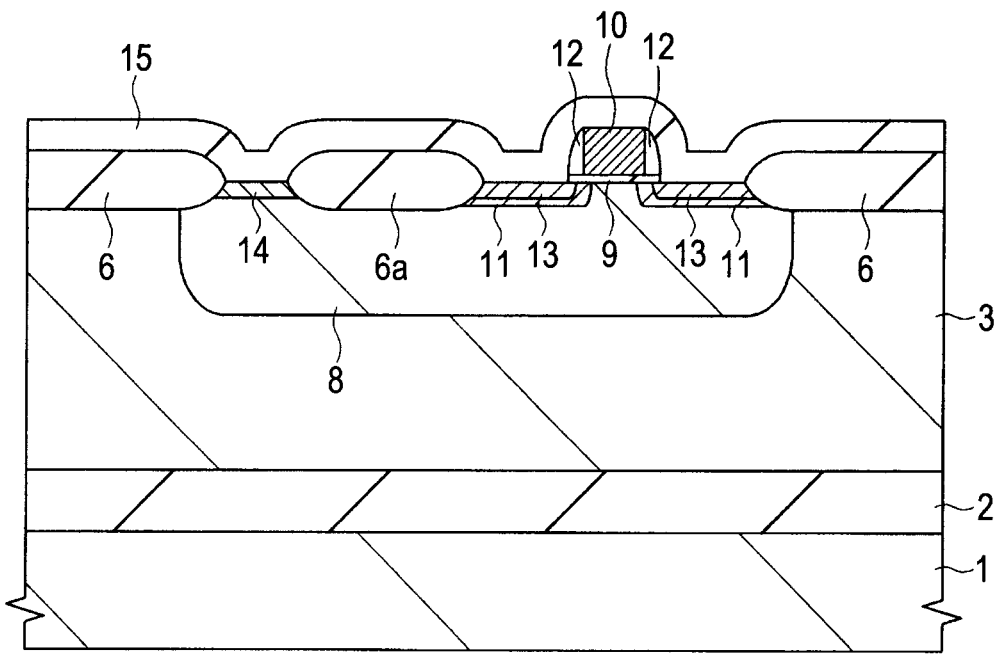
FIG. 6 is a fragmentary cross-sectional view of the same position as that in FIG. 3 during a manufacturing step of the high breakdown voltage semiconductor element following that of FIG. 5.

Next, as illustrated in FIG. 6, an insulating film (hard mask) 15 is deposited on the upper surface of the active layer 3. The insulating film 15 is a TEOS film formed through plasma CVD using TEOS and ozone ($O_3$) as source gases.

Figure 7:
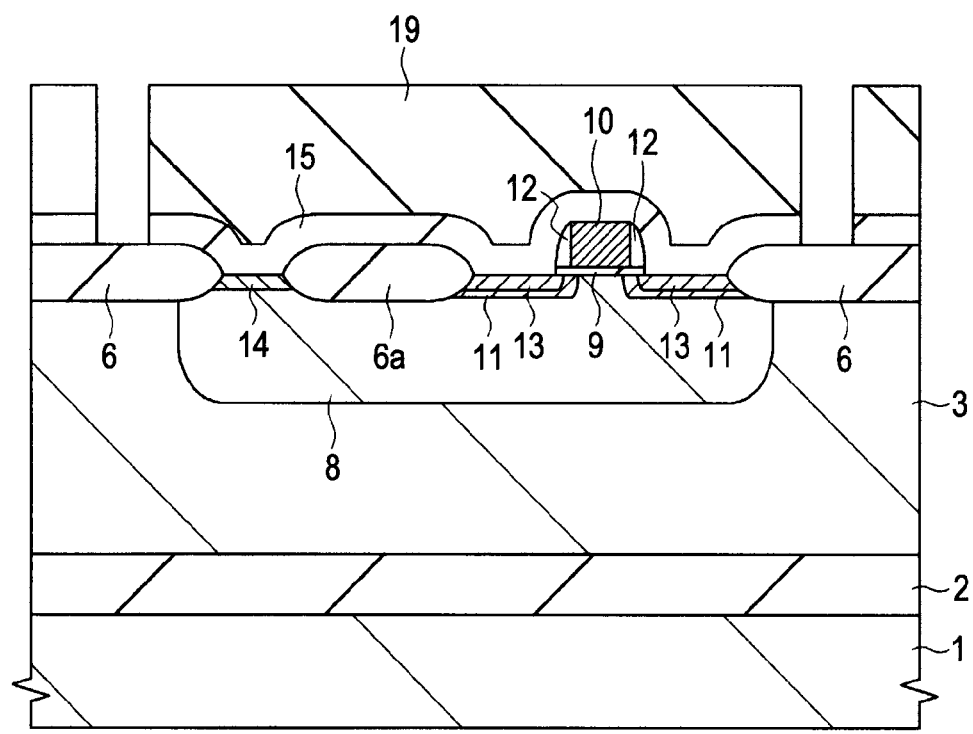
FIG. 7 is a fragmentary cross-sectional view of the same position as that in FIG. 3 during a manufacturing step of the high breakdown voltage semiconductor element following that of FIG. 6.

Next, as illustrated in FIG. 7, a resist pattern 19 for covering a region other than the formation region of the deep trench 4 is formed. Then, by anisotropic dry etching using the resist pattern 19 as a mask, the insulating film 15 is processed to remove the insulating film 15 from the formation region of the deep trench 4. This dry etching uses, for example, a fluorocarbon-based gas ($CF_4$ gas).

Figure 8:
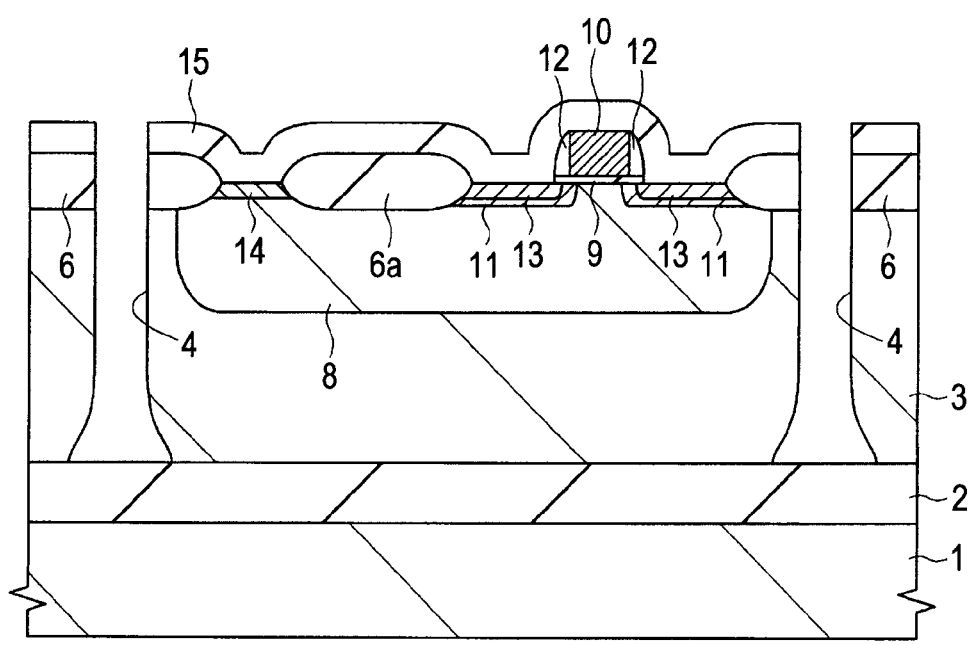
FIG. 8 is a fragmentary cross-sectional view of the same position as that in FIG. 3 during a manufacturing step of the high breakdown voltage semiconductor element following that of FIG. 7.

Next, as illustrated in FIG. 8, after removal of the resist pattern, a deep trench 4 reaching the BOX layer 2 is formed in the LOCOS insulating film 6 and the active layer 3 by anisotropic dry etching with the insulating film 15 as a mask. The deep trench 4 thus formed has a width of, for example, about 0.7 to 0.8 µm. For example a fluorocarbon-based gas (for example, a $CF_4$ gas) is used for dry etching of the LOCOS insulating film 6, while for example an $SF_6$ gas is used for dry etching of the active layer 3. As a result, the deep trench 4 having a substantially equal trench width to that of the mask dimension of the resist pattern 19 is formed.

In the anisotropic dry etching for forming the deep trench 4, the active layer 3 is etched with the etching ions bouncing to the BOX layer 2 and scattering so that the deep trench 4 widens toward the bottom thereof.

Figure 9:
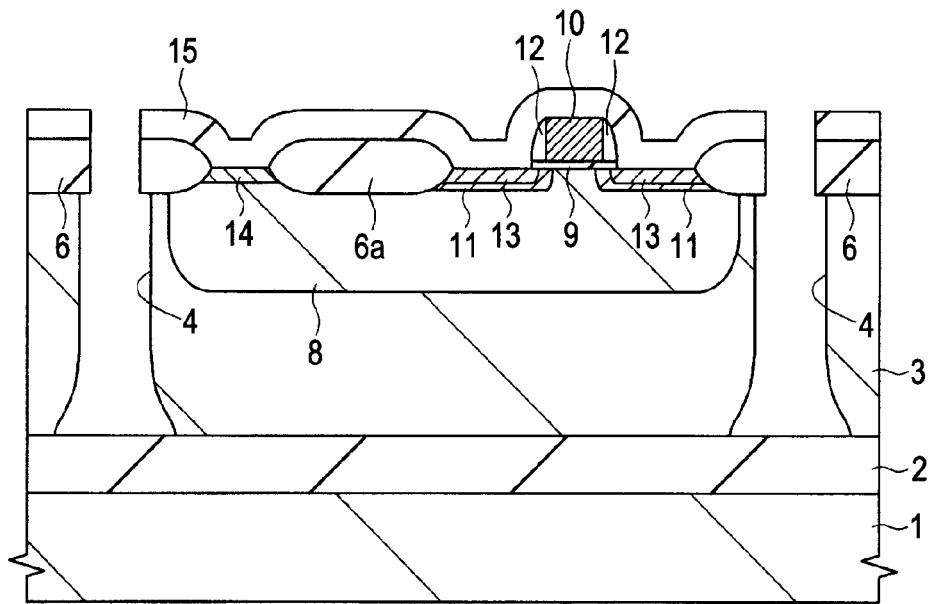
FIG. 9 is a fragmentary cross-sectional view of the same position as that in FIG. 3 during a manufacturing step of the high breakdown voltage semiconductor element following that of FIG. 8.

Next, as illustrated in FIG. 9, isotropic dry etching is conducted to etch the side surface of the deep trench 4 formed in the active layer 3 to increase the trench width of the deep trench 4 formed in the active layer 3, for example, by about 0.1 µm. A decrease in the trench width of the deep trench 4 to less than 0.7 µm reduces the breakdown voltage between two adjacent element regions (trench isolation) so that the trench width of the deep trench 4 formed in the active layer 3 is increased in advance by isotropic dry etching.

The deep trench 4 has, on the upper portion thereof, the LOCOS insulating film 6. The LOCOS insulating film 6 and the active layer 3 are made of different materials from each other so that in the isotropic dry etching, etching processing while securing good selectivity between the LOCOS insulating film 6 and the active layer 3 can be performed and the trench width of the deep trench 4 formed in the active layer 3 can easily be increased. Isotropic dry etching is employed for widening the deep trench, but either dry etching or wet etching may be employed insofar as it is isotropic etching.

The deep trench 4 is formed through the steps described above referring to FIGS. 8 and 9, but the trench width of the trench differs with a position. The trench width (the first width L1 described above referring to FIG. 2) of the upper portion of the deep trench 4 formed in a portion of the LOCOS insulating film 6 is for example, about 0.7 to 0.8 μm, the trench width (the second width L2 described above referring to FIG. 2) of the middle portion of the deep trench 4 formed in the active layer 3 is, for example, about 0.8 to 0.9 μm, and the trench width (the third width L3 described above referring to FIG. 2) of a portion of the deep trench 4 contiguous to the BOX layer 2 is, for example, about 1.6 to 1.8 μm. Although the trench width of the upper portion of the deep trench 4 is, for example, about 0.7 to 0.8 μm, a reduction in the breakdown voltage between two adjacent element regions (trench isolation) can be prevented because the LOCOS insulating film 6 having a width, for example, as wide as 1.2 μm or greater is formed at this portion.

Figure 10:
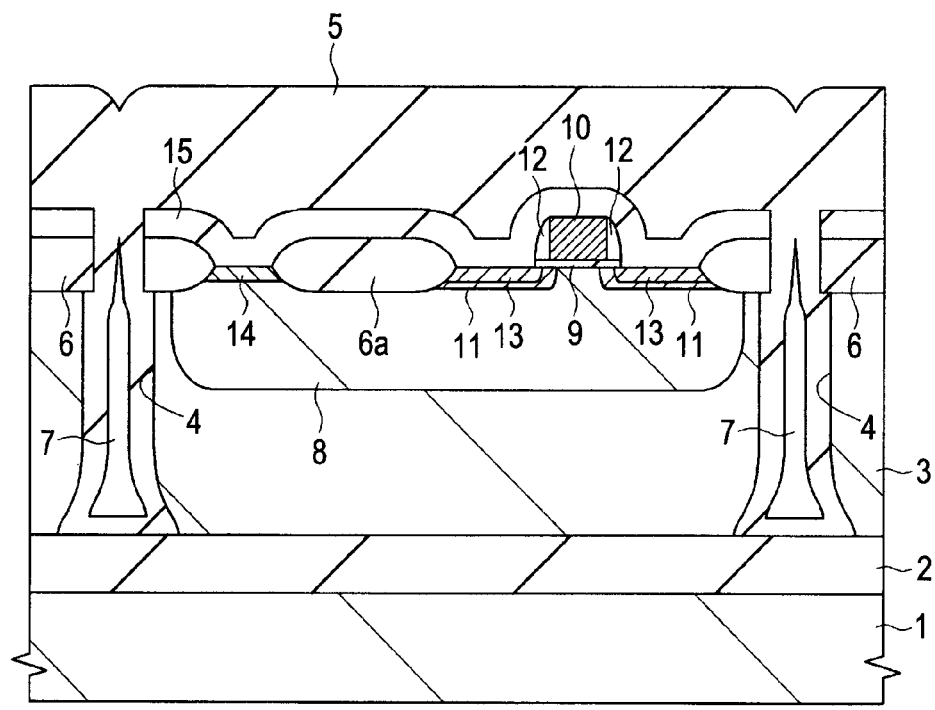
FIG. 10 is a fragmentary cross-sectional view of the same position as that in FIG. 3 during a manufacturing step of the high breakdown voltage semiconductor element following that of FIG. 9.

Next, as illustrated in FIG. 10, an insulating film 5 is deposited on the insulating film 15. The insulating film 5 is, for example, a BPSG (boron phospho silicate glass) film formed, for example, using thermal CVD. The deposition is followed by reflow treatment, for example, at 780° C.

Figure 23A:
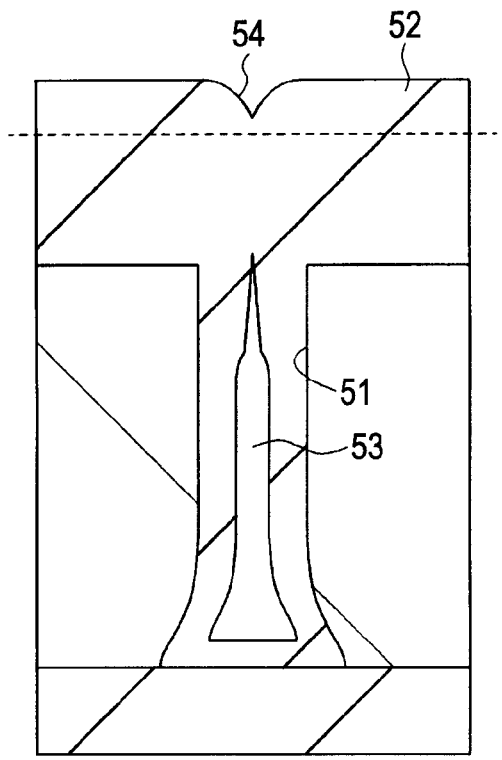
FIG. 23($a$) and FIG. 23($b$) are each a cross-sectional view showing the shape of an insulating film deposited inside the deep trench.
Figure 23B:
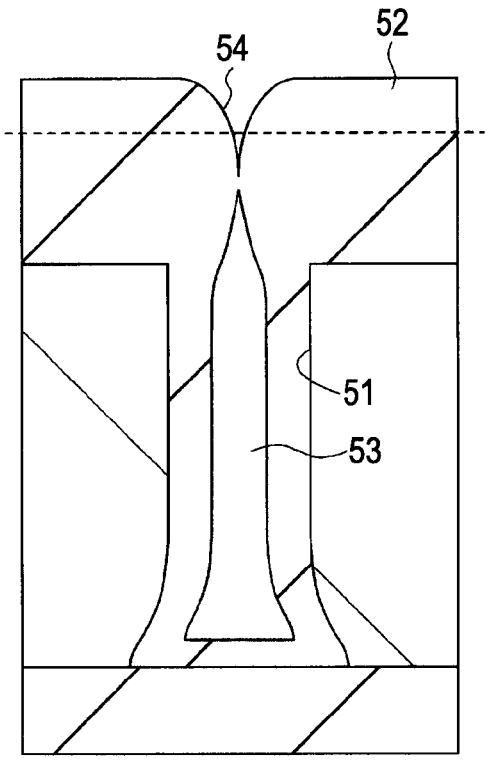

This insulating film 5 is also deposited in the deep trench 4 and filled in the deep trench 4. This insulating film 5 is however not filled completely in the deep trench 4 and a hollow 7 is formed inside the deep trench 4. The trench width of the upper portion of the deep trench 4 is smaller than 1.2 μm so that the width of the hollow 7 at this position is small and the tip of the hollow 7 is located in the vicinity of the upper surface of the LOCOS insulating film 6. The upper surface of the deep trench 4 is closed with the insulating film 5 so that the hollow 7 does not appear from the upper surface of the insulating film 5. In addition, a deep recess (for example, the above-described deep recess 54 as shown in FIG. 23(b)) is not formed on the upper surface of the insulating film 5 at a position opposite to the deep trench 4.

Figure 11:
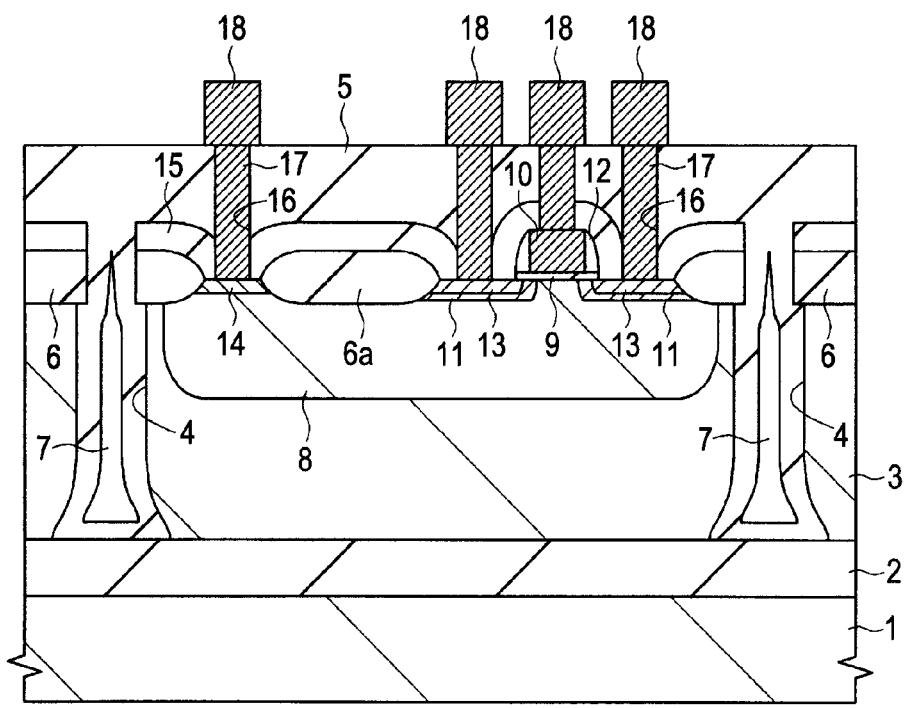
FIG. 11 is a fragmentary cross-sectional view of the same position as that in FIG. 3 during a manufacturing step of the high breakdown voltage semiconductor element following that of FIG. 10.

Next, as illustrated in FIG. 11, the upper surface of the insulating film 5 is polished using, for example, CMP. At this time, the recess on the upper surface of the insulating film 5 is not deep so that the recess can be removed from the upper surface of the insulating film 5 without thickly polishing the upper surface of the insulating film 5. The tip of the hollow 7 formed in the deep trench 4 is located in the vicinity of the upper surface of the LOCOS insulating film 6 so that the upper surface of the insulating film 5 can be planarized while preventing the appearance of the hollow 7 from the upper surface of the insulating film 5.

Next, by using dry etching with a resist pattern as a mask, contact holes 16 reaching the gate electrode 10 of the high breakdown voltage nMIS, the n type semiconductor region 13 of the high breakdown voltage nMIS, and the p type semiconductor region 14 formed in the power feed region of the p well 8 are formed, respectively, in the insulating films 5 and 15. Then, after deposition of a conductive substance, for example, a metal film made of tungsten (W) or the like on the insulating film 5 so as to fill it in the contact holes 16, the metal film is polished using, for example, CMP to leave the metal film only inside the contact holes 16. Plugs 17 are thus formed in the contact holes 16, respectively. After deposition of a metal film having, for example, aluminum (Al) as a main conductor on the insulating film 5, the metal film is processed using dry etching with a resist pattern as a mask to form a plurality of wirings 18 to be coupled to the respective upper surfaces of the plugs 17. By the steps described above, the high breakdown voltage nMIS of the first embodiment is substantially completed.

In the first embodiment, the deep trench 4 is required to have a trench width of 0.7 μm or greater so as to prevent a reduction in the breakdown voltage between two adjacent element regions. The trench width is not however limited to 0.7 μm or greater, because the trench width capable of preventing a reduction in breakdown voltage differs, depending on the high breakdown voltage nMIS employed.

In the embodiment 1, the trench width of the middle portion of the deep trench 4 is increased, for example, by about 0.1 μm from the trench width of the upper portion of the deep trench 4 by using isotropic etching but the width of the deep trench may be increased further. This makes it possible to improve the breakdown voltage between two adjacent element regions.

Thus, in the first embodiment, element isolation is comprised of SOI isolation, trench isolation, and LOCOS isolation in combination. In addition, the trench width of the deep trench 4 configuring the trench isolation except for the lower portion, that is, a portion contiguous to the BOX layer 2 and the widening bottom portion in the vicinity thereof is made smaller than 1.2 μm. For example, the width of the upper portion of the deep trench 4 is set at about 0.7 to 0.8 μm and the width of the middle portion between the upper portion and the lower portion is set at about 0.8 to 0.9 μm. When the deep trench 4 is filled with the insulating film 5, a deep recess is not formed at a position on the upper surface of the insulating film 5 opposite to the deep trench 4 and the hollow 7, which is formed inside the deep trench 4, has a tip in the vicinity of the upper surface of the LOCOS insulating film 6 so that the upper surface of the deep trench 4 can be closed with the insulating film 5. Accordingly, the hollow 7 does not appear from the upper surface of the insulating film 5 and the upper surface of the insulating film 5 can be planarized into a recess-free flat surface.

On the other hand, when the trench width of the deep trench 4 is smaller than 0.7 μm, a reduction in breakdown voltage between two adjacent element regions occur. The LOCOS insulating film 6 having a width as wide as, for example, 1.2 μm or greater however lies on the upper, portion of the deep trench 4 having a width of, for example, about 0.7 to 0.8 μm so that the reduction in breakdown voltage can be prevented by this LOCOS insulating film 6.

The depression disappears from the upper surface of the insulating film 5 and the hollow 7 does not appear therefrom so that even when a metal film configuring the plug 17 or a metal film configuring the wiring 18 is deposited on the insulating film 5, these metal films neither remain on the upper surface of the insulating film 5 nor enter the hollow 7. Moreover, the width of element isolation can be set to a value capable of preventing a reduction in breakdown voltage between two adjacent element regions. As a result, it is possible to prevent deterioration in the reliability of a semiconductor device attributed to element isolation.

Second Embodiment

Figures 12, 13:
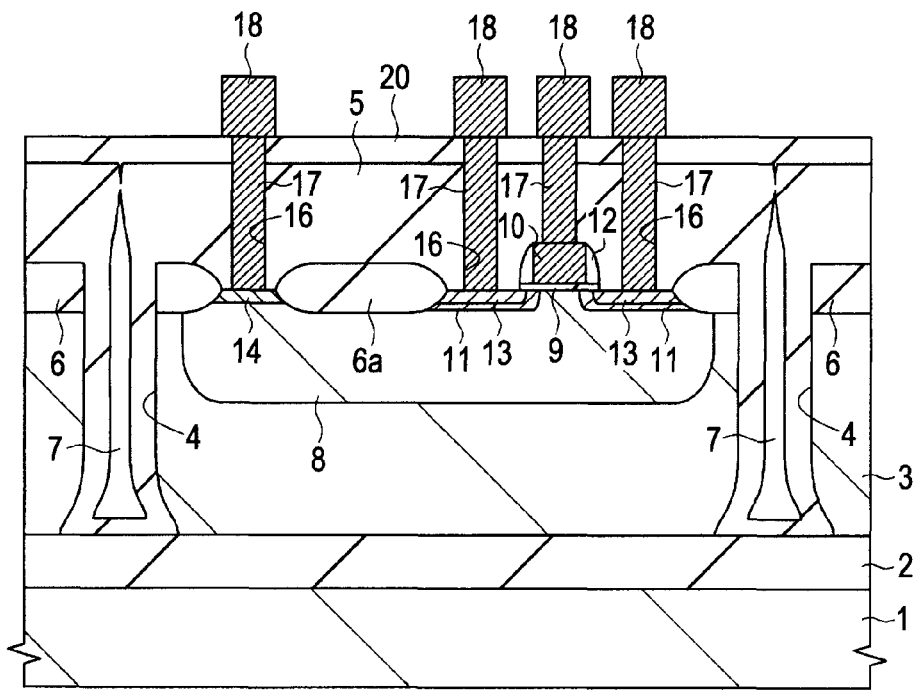
FIG. 12 is a fragmentary cross-sectional view showing a high breakdown voltage semiconductor element formed on an SOI substrate according to Embodiment 2 of the invention.
FIG. 13 is a diagram for showing an example of a manufacturing method of a high breakdown voltage semiconductor element formed on an SOI substrate according to a second embodiment of the invention and it is a fragmentary cross-sectional view of the high breakdown voltage semiconductor element.

The structure of a high breakdown voltage semiconductor element formed on an SOI substrate according to the second embodiment is shown in FIG. 12. FIG. 12 is a fragmentary cross-sectional view showing the high breakdown voltage semiconductor element formed on an SOI substrate and as an example of the high breakdown voltage semiconductor element, a high breakdown voltage nMIS is shown.

As illustrated in FIG. 12, similar to the high breakdown voltage nMIS of the first embodiment, the high breakdown voltage nMIS is formed on an SOI substrate. An island-like active layer 3 surrounded with a BOX layer 2, an insulating film 5 filled in a deep trench 4 coupled to the BOX layer 2 and an LOCOS insulating film 6 coupled to a portion of the insulating film 5 filled in the deep trench 4 is an element region in which the high breakdown voltage nMIS is to be formed. This means that the element isolation in the second embodiment also employs a dielectric isolation system having SOI isolation, trench isolation, and LOCOS isolation in combination.

The second embodiment is however different from the first embodiment in that a cap film 20 is formed on the insulating film 5 having both a function as a film buried in the deep trench 4 and a function as an interlayer insulating film. The cap film 20 is an insulating film and it is, for example, a TEOS film formed using plasma CVD. It has a thickness of, for example, about 0.12 µm.

In the first embodiment, when the upper surface of the insulating film 5 filled in the deep trench 4 is polished using CMP, a recess remains on the upper surface of the insulating film 5 at a position opposite to the deep trench 4; and the trench width of the deep trench 4 is made smaller than 1.2 µm (except for a portion contiguous to the BOX layer 2 and a lower portion in the vicinity thereof which widens toward the bottom) to prevent the hollow 7 inside the deep trench 4 from appearing from the upper surface of the insulating film 5. In the second embodiment, on the other hand, even when a recess remains on the upper surface of the insulating film 5 or the hollow 7 formed inside the deep trench 4 appears from the upper surface of the insulating film 5, the upper surface of the insulating film 5 is covered with the cap film 20 to cover the recess or hollow 7 with the cap film as a lid, thereby preventing the metal film from entering the recess or the hollow 7.

When the width of the deep trench 4 is set at, for example, 1.2 µm or greater in order to improve the breakdown voltage between two adjacent element regions, a deep recess is formed (refer to, for example, FIG. 23(b)) on the upper surface of the insulating film 5 at a position opposite to the deep trench 4. Even after polishing of the upper surface of the insulating film 5 by using, for example, CMP, the recess remains on the upper surface of the insulating film 5. By further polishing of the upper surface of the insulating film 5 to remove this recess, the hollow 7 inevitably appears from the upper surface of the insulating film 5. After that, when the upper surface of the insulating film 5 is covered with the cap film 20, the recess or hollow 7 can be covered with the cap film as a lid. Even if the cap film 20 enters the recess or hollow 7, no inconvenience occurs in the element isolation because the cap film 20 is an insulating film.

Next, an example of a manufacturing method of a high breakdown voltage semiconductor element formed on an SOI substrate according to the second embodiment will be described in order of steps referring to FIGS. 13 to 17. FIGS. 13 to 17 are fragmentary cross-sectional views of the high breakdown voltage nMIS formed on an SOI substrate. Since the manufacturing steps of the second embodiment from the formation of the high breakdown voltage nMIS in the element region of the SOI substrate to the removal of a portion of the insulating film 15 (steps described in the first embodiment referring to FIGS. 3 to 7) are similar to those of the first embodiment, a description on them is omitted.

Following the step described in the first embodiment referring to FIG. 7, a deep trench 4 reaching the Box layer is formed in the LOCOS insulating film 6 and the active layer 3 as illustrated in FIG. 13 by using anisotropic dry etching with the insulating film 15 as a mask. The trench width of the deep trench 4 is, for example, about 1.3 µm. For the dry etching of the LOCOS insulating film 6, for example a fluorocarbon-based gas (for example, $CF_4$ gas) is used, while for example an $SF_6$ gas is used for the dry etching of the active layer 3.

Similar to the first embodiment, in the anisotropic dry etching for forming the deep trench 4 in the active layer 3, the active layer 3 is etched with etching ions bouncing to the BOX layer 2 and scattering so that the deep trench 4 widens toward the bottom thereof.

Figure 14:
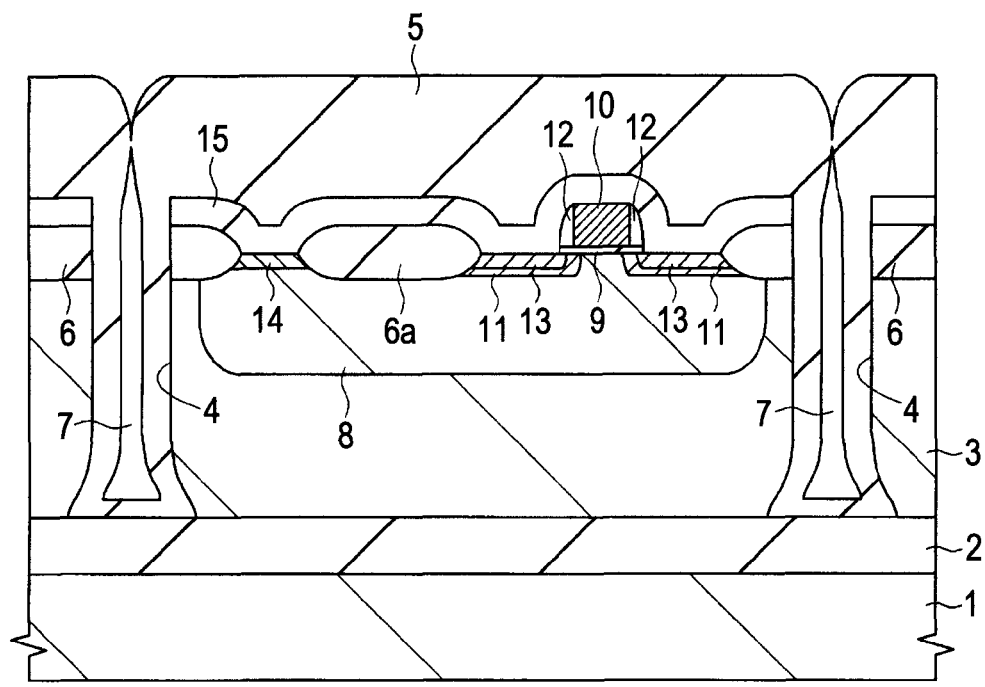
FIG. 14 is a fragmentary cross-sectional view of the same position as that in FIG. 13 during a manufacturing step of the high breakdown voltage semiconductor element following that of FIG. 13.

Next, as illustrated in FIG. 14, an insulating film 5 is deposited on the insulating film 15. The insulating film 5 is a BPSG film formed, for example, using thermal CVD. After deposition, reflow treatment is performed at a temperature of, for example, 780° C.

This insulating film 5 is deposited also in the deep trench 4 to fill the deep trench 4 therewith. The insulating film 5 is however not filled completely in the deep trench 4 and a hollow 7 is formed in the deep trench 4. The width of the upper portion of the deep trench 4 is as wide as, for example, about 1.3 µm so that the hollow 7 exceeds the upper surface of the LOCOS insulating film 6.

Figure 15:
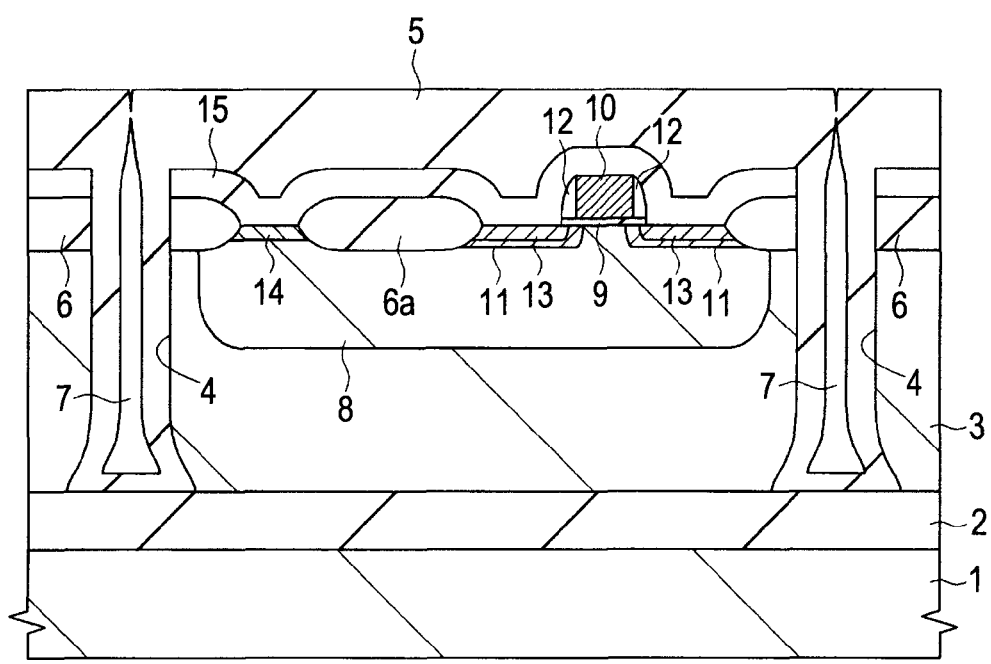
FIG. 15 is a fragmentary cross-sectional view of the same position as that in FIG. 13 during a manufacturing step of the high breakdown voltage semiconductor element following that of FIG. 14.

Next, as illustrated in FIG. 15, the upper surface of the insulating film 5 is polished using, for example, CMP to planarize it. Even when the upper surface of the insulating film 5 is polished, a recess remains on the upper surface of the insulating film 5. Further polishing of the upper surface of the insulating film 5 in order to remove this recess results in inevitable appearance of the hollow 7 from the upper surface of the insulating film 5.

Figure 16:
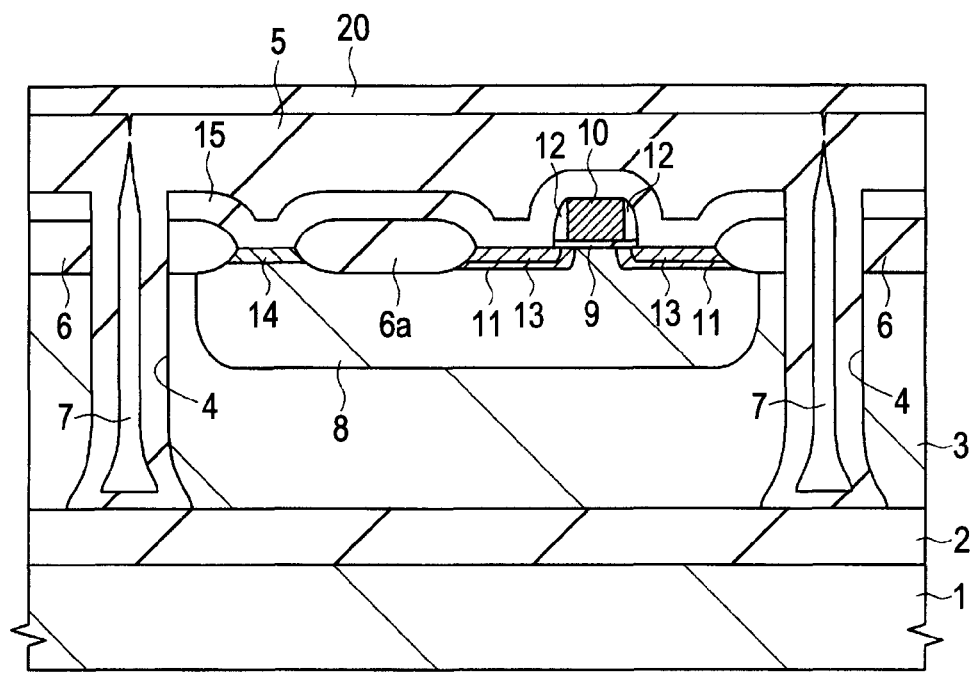
FIG. 16 is a fragmentary cross-sectional view of the same position as that in FIG. 13 during a manufacturing step of the high breakdown voltage semiconductor element following that of FIG. 15.

Next, as illustrated in FIG. 16, a cap film 20 is deposited on the insulating film 5. The cap film 20 is, for example, a TEOS film formed using plasma CVD and it has a thickness of, for example, about 0.12 µm. By covering the upper surface of the insulating film 5 with the cap film 20, the recess or hollow 7 on the upper surface of the insulating film 5 can be covered with the cap film as a lid.

Figure 17:
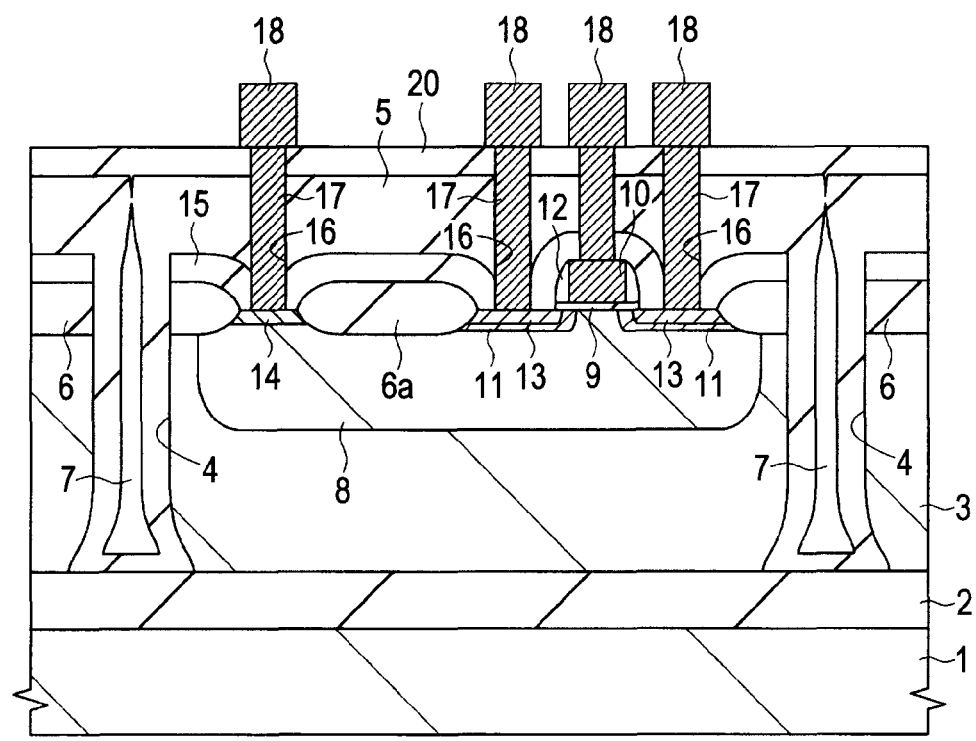
FIG. 17 is a fragmentary cross-sectional view of the same position as that in FIG. 13 during a manufacturing step of the high breakdown voltage semiconductor element following that of FIG. 16.

Then, as illustrated in FIG. 17, similar to the first embodiment, contact holes 16, plugs 17, wirings 18, and the like are formed, whereby formation of the high breakdown voltage nMIS according to the second embodiment is substantially completed.

In this second embodiment, the trench width of the deep trench 4 is set at, for example, about 1.3 µm. The width is not limited to it, but can be set at a desired width capable of preventing a reduction in the breakdown voltage between two adjacent element regions.

In the second embodiment, the trench width of the upper portion of the deep trench 4 (the upper portion formed in a portion of the LOCOS insulating film 6) and the trench width of the middle portion of the deep trench 4 (between the upper portion formed in a portion of the LOCOS insulating film 6 and the lower portion contiguous to the BOX layer 2 and the widening bottom portion in the vicinity thereof) are the same, but as in the first embodiment, the upper portion of the deep trench 4 can be made smaller than the trench width of the middle portion of the deep trench 4.

Thus, according to the second embodiment, even when the recess remains on the upper surface of the insulating film 5 or the hollow 7 which has been formed inside the deep trench 4 appears from the upper surface of the insulating film upon planarization of the upper surface of the insulating film 5, the cap film 20 serving as a lid prevents a metal film configuring the plugs 17 or a metal film configuring the wirings 18 from entering the recess or hollow 7. Moreover, the width of the element isolation can be set at a width capable of preventing a reduction in the breakdown voltage between two adjacent element regions. This makes it possible to prevent deterioration in the reliability of the semiconductor device attributed to element isolation.

Third Embodiment

In the element isolation according to the third embodiment, respective deep trenches annularly surrounding two or more adjacent element regions therewith have been coupled to each other.

To clearly show the element isolation structure according to the third embodiment, a brief description will be made, prior to the description on the invention, on element isolation in which respective deep trenches annularly surrounding two or more adjacent element regions therewith have been coupled to each other.

Figure 18:
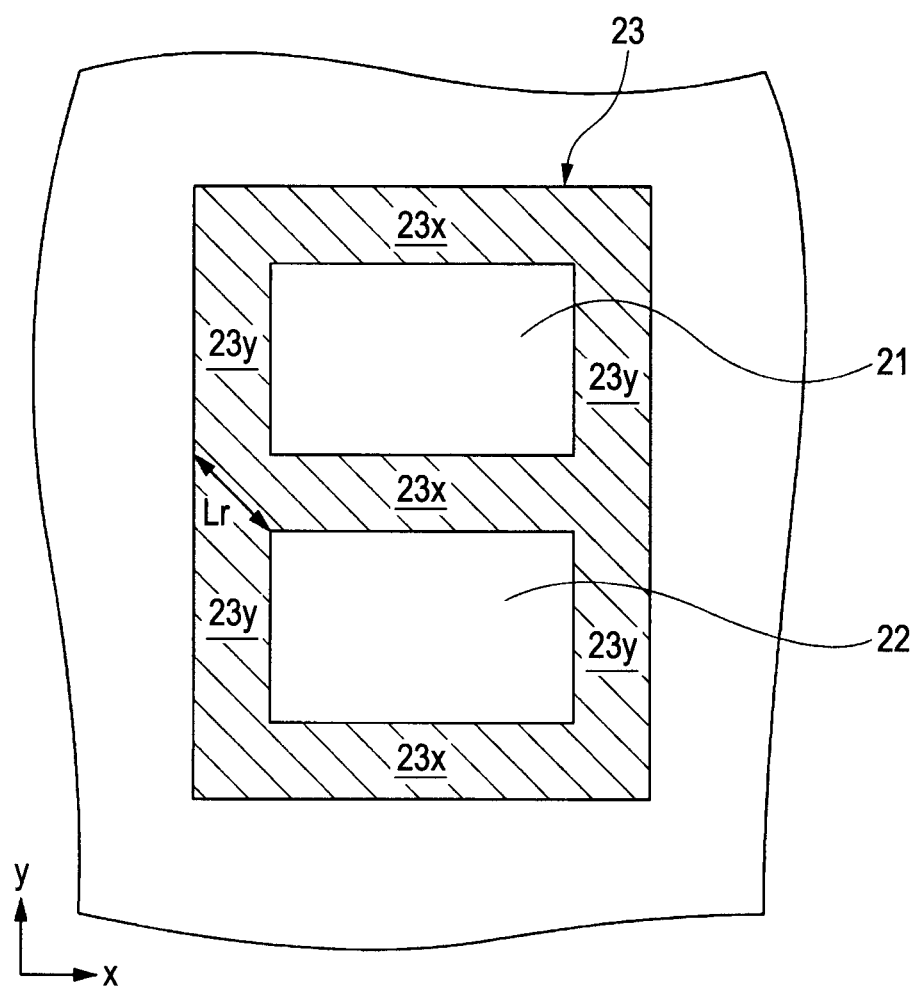
FIG. 18 is a top view showing element isolation investigated by the present inventors, in which respective deep trenches annularly surrounding two adjacent element regions therewith have been coupled to each other to form a FIG. 8 shape.

FIG. 18 is a top view showing element isolation investigated by the present inventors in which respective deep trenches annularly surrounding two or more adjacent element regions therewith have been coupled to each other. The term "first direction" as used in this description means a direction x shown in FIG. 8 and the term "second direction" means a direction y perpendicular to the first direction shown in FIG. 18.

As illustrated in FIG. 18, a first element region 21 and a second element region 22, which are adjacent to each other in the second direction (direction y), are surrounded with a deep trench 23. The deep trench 23 has therefore a FIG. 8 shape in which three deep trenches 23x formed along the first direction (direction x) have been coupled to two deep trenches 23y formed along the second direction (direction y).

The deep trench 23x between the first element region 21 and the second element region 22 is coupled, at the end portions thereof, to the deep trenches 23y, while forming a T-shape. At a certain position of these T-shaped portions of the deep trench 23, the trench depth becomes wider than that of the deep trench 23x formed along the first direction (direction x) or that of the deep trench 23y formed along the second direction (direction y). Described specifically, a trench width Lr in the diagonal direction, which is shown by an arrow in the T-shaped portion of FIG. 18, is about 1.4 times as much as the trench width of the deep trench 23x formed along the first direction (direction x) or the trench width of the deep trench 23y formed along the second direction (direction y). Even when the trench width of the deep trench 23x formed along the first direction (direction x) or the trench width of the deep trench 23y formed along the second direction (direction y) is set at, for example, 0.8 μm, the trench width in the diagonal direction in the T-shaped portion becomes 1.2 to 1.3 μm. When the trench width of the deep trench 23 is 1.2 μm or greater, a deep recess is likely to be formed on the upper surface of an insulating film at a position opposite to the deep trench 23 or a hollow is likely to be formed even in the vicinity of the upper surface of the insulating film, upon filling of the insulating film in the deep trench 23. The recess on the upper surface of the insulating film remains even after polishing of the upper surface of the insulating film by using CMP or the like. If the upper surface of the insulating film is polished further to remove this recess, the hollow at last appears from the upper surface.

In the third embodiment, remaining of the recess or exposure of the hollow in the T-shaped portion of the deep trench 23 is therefore prevented by setting the trench width in the T-shaped portion of the deep trench 23 equal to or smaller than the trench width of the deep trench 23x formed along the first direction (direction x) or the trench width of the deep trench 23y formed along the second direction (direction y).

Figure 19:
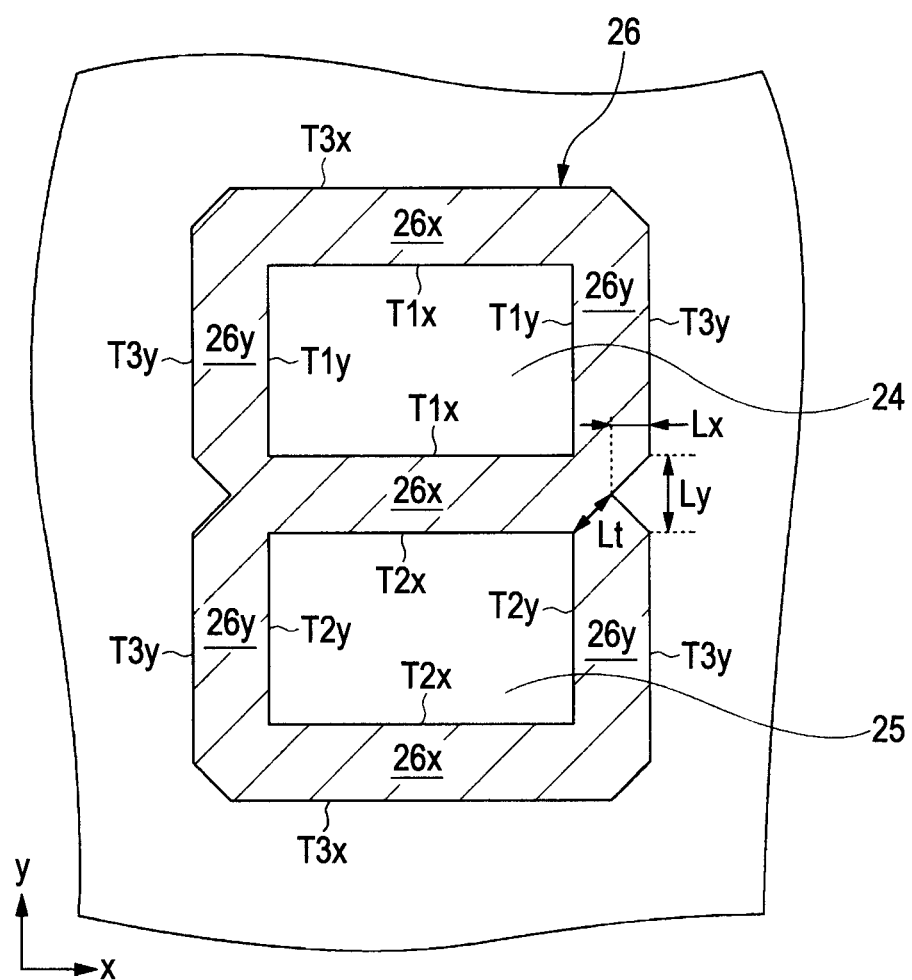
FIG. 19 is a top view showing element isolation according to a third embodiment of the invention, in which respective deep trenches annularly surrounding two adjacent element regions therewith have been coupled to each other to form a FIG. 8 shape.

The element isolation structure according to the third embodiment will next be described referring to FIG. 19. FIG. 19 is a top view showing element isolation in which respective deep trenches annularly surrounding two adjacent element regions therewith have been coupled to each other. FIG. 19 shows a mask pattern used for the formation of the deep trench and the dimension shown herein is a so-called mask dimension. Only the shape of the deep trench is illustrated in FIG. 19, but in this embodiment, as in the first or second embodiment described above, a dielectric isolation system using SOI isolation, trench isolation, and LOCOS isolation in combination is employed for the practical element isolation.

As illustrated in FIG. 19, a first element region 24 and a second element region 25 adjacent to each other along a second direction (direction y shown in FIG. 19) are surrounded with a deep trench 26. Therefore, the deep trench 26 has a FIG. 8 shape in which three deep trenches 26x formed along a first direction (direction x shown in FIG. 19), which is a direction perpendicular to the second direction, and two deep trenches 26y formed along the second direction (direction y) have been coupled to each other. The deep trench 26x between the first element region 24 and the second element region 25 is coupled, at the end portions thereof, to the deep trenches 26y, while forming a T-shape.

The side surface of the deep trench 26x contiguous to the first element region 24 is designated as a first x side-surface T1x, the side surface of the deep trench 26y contiguous to the first element region 24 as a first y side-surface T1y, the side surface of the deep trench 26x contiguous to the second element region 25 as a second x side-surface T2x, the side surface of the deep trench 26y contiguous to the second element region 25 as a second y side-surface T2y, the side surface of the outer frame opposite to the first x side-surface T1x of the deep trench 26x and the side surface of the outer frame opposite to the second x side-surface T2x each as a third x side-surface T3x, and the side surface of the outer frame opposite to the first y side-surface T1y of the deep trench 26y and the side surface opposite to the second y side-surface T2y each as a third y side-surface T3y.

In the T-shaped portion, the first x side-surface T1x and the first y side-surface T1y at an intersection therebetween and the second x side-surface T2x and the second y side-surface T2y at an intersection therebetween are each, in a planar view, at right angles to each other. In the T-shaped portion, the third y side-surface T3y is depressed in a wedge form toward the deep trench 26x between the first element region 24 and the second element region 25. The dimension (Ly) of this wedge-shaped depression along the second direction (direction y) is equal to the trench width of the deep trench 26x between the first element region 24 and the second element region 25 and the dimension (Lx) of this wedge-shaped depression along the first direction (direction x) is desirably half of the trench width of the deep trench 26y.

Figure 20:
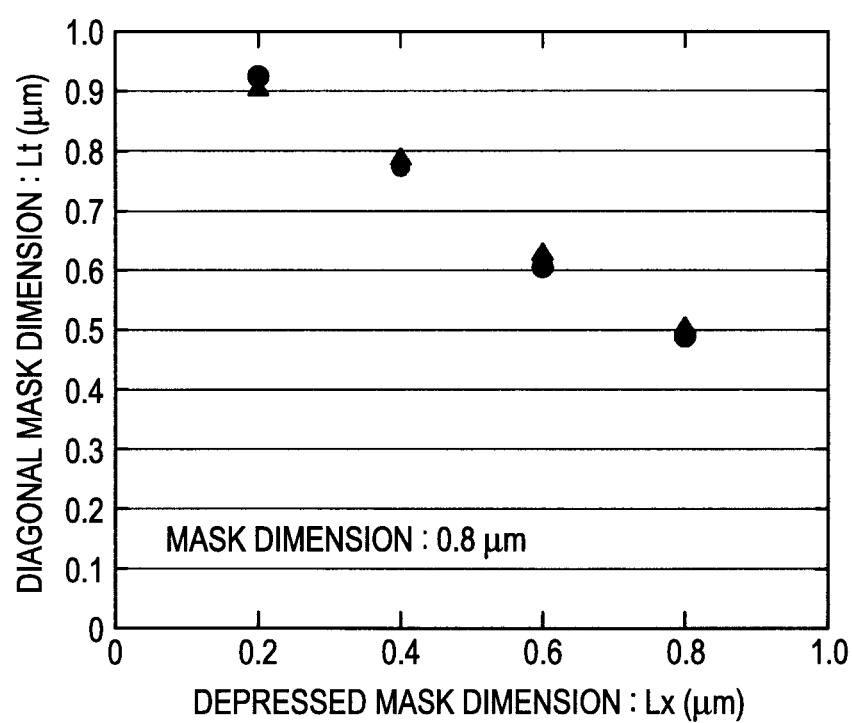
FIG. 20 is a graph for showing the relationship between a diagonal mask dimension and a depressed mask dimension in a T-shaped portion of element isolation in the third embodiment of the invention.

FIG. 20 is a graph for describing the relationship between a mask dimension (the dimension Lt shown in FIG. 19 which will hereinafter be called "diagonal mask dimension") from the intersection between the first x side-surface T1$x$ of the deep trench 26$x$ and the first y side-surface T1$y$ of the deep trench 26$y$, each contiguous to the first element region 24, to the apex of the depression and a mask dimension (Lx shown in FIG. 19 which will hereinafter be called "depressed mask dimension") of a mask from the 3$y$ side-surface T3$y$ of the deep trench 26$y$ to the wedge-shaped depression. The trench width (mask dimension) of the deep trenches 26$x$ and 26$y$ is 0.8 μm.

As illustrated in FIG. 20, when the depressed mask dimension (Lx) is 0.4 μm, that is, half of the trench width, the diagonal mask dimension (Lt) becomes approximately equal to 0.8 μm. As the depressed mask dimension (Lx) exceeds 0.4 μm, the diagonal mask dimension (Lt) decreases further, which prevents formation of the above-described deep recess on the upper surface of the insulating film or formation of the hollow extending near the upper surface of the insulating film, each in the T-shaped portion. When the trench width of the deep trench 26 decreases excessively, however, a reduction in the breakdown voltage between the element regions occurs in the T-shaped portion.

The trench width of the deep trench 26 is desirably uniform in order to prevent a regional reduction in breakdown voltage. In the third embodiment, therefore, the trench width of the deep trench 26 is made almost uniform (about 0.8 μm) by adjusting the depressed mask dimension (Lx) to 0.4 μm.

Figure 21:
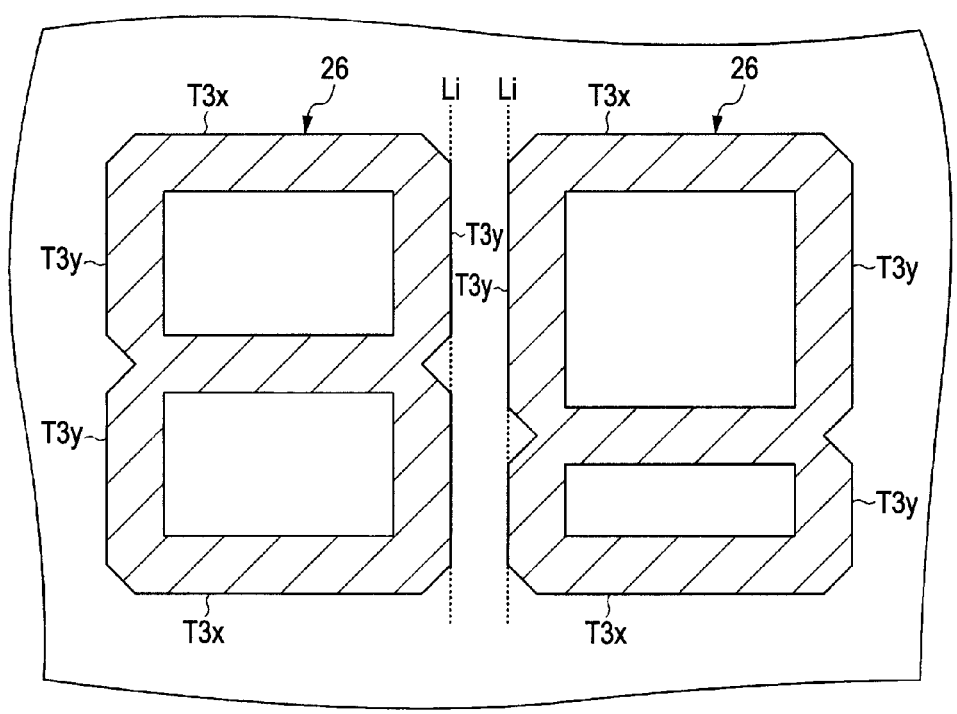
FIG. 21 is a top view of a deep trench according to the third embodiment of the invention in the case where two element isolation structures having a FIG. 8 shape in which deep trenches annularly surrounding two adjacent element regions therewith, respectively, have been coupled to each other are placed adjacent to each other.

FIG. 21 shows another example of the element isolation structure according to the third embodiment. FIG. 21 is a top view of a deep trench in the case where two element isolation structures each having a FIG. 8 shape in which deep trenches annularly surrounding two adjacent element regions therewith, respectively, have been coupled to each other are placed adjacent to each other.

Since the wedge-shaped depression is formed in the T-shaped portion, the deep trench 26 is not formed outside an extended line Li (the dotted line in FIG. 21) of the 3$y$ side-surface T3$y$ of the deep trench 26. Two adjacent element isolations can therefore be placed while minimizing their design dimension, which also contributes to an increase in the degree of integration of a semiconductor device.

Figure 22:
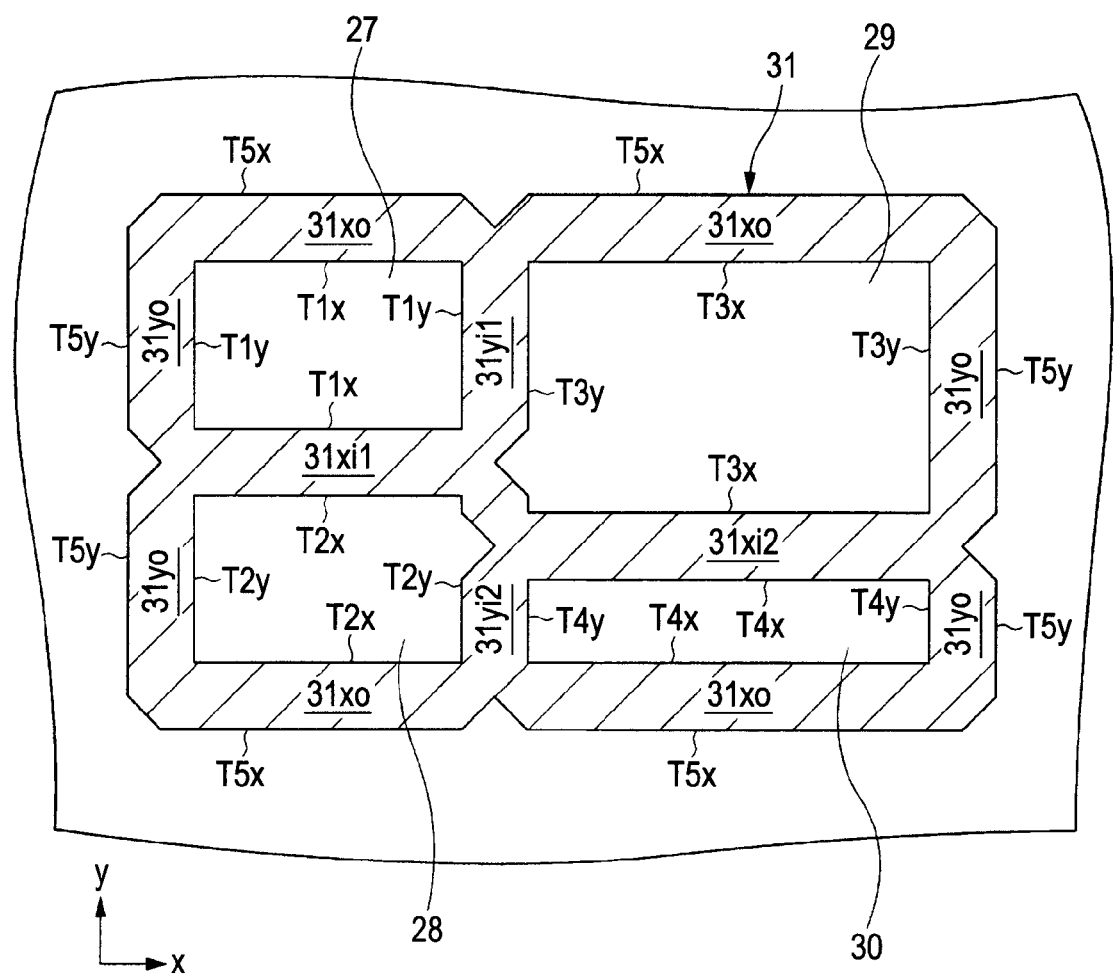
FIG. 22 is a top view of four-square grid shaped element isolation according to the third embodiment of the invention in which deep trenches annularly surrounding four adjacent element regions respectively have been coupled to each other.

FIG. 22 shows a further example of the element isolation structure according to the third embodiment. FIG. 22 is a top view of four-square grid shaped element isolation in which deep trenches annularly surrounding four adjacent element regions respectively have been coupled to each other. Only the shape of the deep trench is illustrated in this drawing, but similar to the first or second embodiment described above, a dielectric isolation system using SOI isolation, trench isolation, and LOCOS isolation in combination is employed for the element isolation.

As illustrated in FIG. 22, four element regions adjacent to each other (a first element region 27, a second element region 28, a third element region 29, and a fourth element region 30) are surrounded with a deep trench 31. Accordingly, the deep trench 31 has a four-square grid shape in which two deep trenches 31$xo$ formed along a first direction (direction x illustrated in FIG. 22) and two deep trenches 31$yo$ formed along a second direction (direction y in FIG. 22) perpendicular to the first direction, each configuring the outer frame of the element isolation; and two deep trenches 31$xi$1 and 31$xi$2 formed along the first direction (direction x) and two deep trenches 31$yi$1 and 31$yi$2 formed along the second direction (direction y), each configuring the inner frame of the element isolation, have been coupled to each other.

In the T-shaped portion formed on the outer frame of element isolation, similar to the element isolation shown in FIG. 19, the deep trench 31$xo$ and the deep trench 31$yo$ each has a wedge-shaped depression.

Further, in the T-shaped portion formed in the inner frame of element isolation, the deep trenches 31$yi$1 and 31$yi$2 each has a wedge-shaped depression. These two deep trenches 31$yi$1 and 31$yi$2 configuring the inner frame of the element isolation and formed along the second direction (direction y) are formed on one line, but two deep trenches 31$xi$1 and 31$xi$2 configuring the inner frame of the element isolation and formed along the first direction (direction x) are not formed on one line. T-shaped coupling is therefore formed between the end portion of the deep trench 31$xi$1 between the first element region 27 and the second element region 28 and the deep trench 31$yi$1; and between the end portion of the deep trench 31$xi$2 between the third element region 29 and the fourth element region 30 and the deep trench 31$yi$2.

The side surfaces of the deep trenches 31$xo$ and 31$xi$1 contiguous to the first element region 27 are designated as a first x side-surface T1$x$, the side surfaces of the deep trenches 31$yo$ and 31$yi$1 contiguous to the first element region 27 as a first y side-surface T1$y$, the side surfaces of the deep trenches 31$yo$ and 31$xi$1 contiguous to the second element region 28 as a second x side-surface T2$x$, the side surfaces of the deep trenches 31$yo$, 31$yi$1, and 31$yi$2 contiguous to the second element region 28 as a second y side-surface T2$y$, the side surfaces of the deep trenches 31$xo$ and 31$xi$2 contiguous to the third element region 29 as a third x side-surface T3$x$, the side surfaces of the deep trenches 31$yo$ and 31$yi$1 contiguous to the first element region 29 as a 3$y$ side-surface T3$y$, the side surfaces of the deep trenches 31$xo$ and 31$xi$2 contiguous to the fourth element region 30 as a fourth x side-surface T4$x$, and the side surfaces of the deep trenches 31$yo$ and 31$yi$2 contiguous to the fourth element region 30 as a fourth y side-surface T4$y$. In addition, the side surfaces of the deep trench 31$xo$ of the outer frame opposite to the first x side-surface T1$x$, opposite to the second x side-surface T2$x$, opposite to the third x side-surface T3$x$, and opposite to the fourth x side-surface T4$x$ are each designated as a fifth x side-surface T5$x$; and the side surface of the deep trench 31$yo$ of the outer frame opposite to the first y side-surface T1$y$, opposite to the second y side-surface T2$y$, opposite to the third 3$y$ side-surface T3$y$, and opposite to the fourth y side-surface T4$y$ are each designated as a fifth y side-surface T5$y$.

In one of the T-shaped portions formed in the inner frame of the element isolation, the 3$y$ side-surface T3$y$ of the third element region 29 has, in a planar view, a wedge-shaped depression toward the deep trench 31$xi$1 between the first element region 27 and the second element region 28. It is preferred that the dimension of this wedge-shaped depression along the second direction (direction y) is equal to the trench width of the deep trench 31$xi$1 between the first element region 27 and the second element region 28, while the dimension of this wedge-shaped depression in the first direction (direction x) is half of the width of the deep trench 31$yi$1. In the other T-shaped portion, the second y side-surface T2$y$ of the second element region has, in a planar view, a wedge-shaped depression toward the deep trench 31$xi$2 between the third element region 29 and the fourth element region 30. It is preferred that the dimension of this wedge-shaped depression in the second direction (direction y) is equal to the trench width of the deep trench 31$xi$2 between the third element region 29 and the fourth element region 30, while the dimension of this wedge-shaped depression in the first direction (direction x) is half of the trench width of the deep trench 31$yi$2.

Thus, according to the third embodiment, in the T-shaped portion where the end portion of the deep trench formed along the first direction (direction x) between the first element region and the second element region placed adjacent to each other along the second direction (direction y) has been coupled to the deep trench formed along the second direction (direction y), the side surface of the deep trench formed along the second direction (direction y) opposite to the first element region and the second element region is, in a planar view, depressed in a wedge form toward the deep trench between the first element region and the second element region to make the trench width of the T-shaped portion in the diagonal direction equal to or smaller than the trench width of the deep trench formed along the first direction (direction x) or the trench width of the deep trench formed along the second direction (direction y). As a result, when an insulating film is filled in the deep trench in the T-shaped portion of the deep trench, the depth of the recess formed on the upper surface of the insulating film at a position opposite to the deep trench decreases and the upper surface of the insulating film can be planarized without deep polishing of it. In addition, the hollow formed inside the deep trench does not extend to the vicinity of the upper surface of the insulating film so that the exposure of the hollow can be prevented.

The invention made by the present inventors has been described specifically based on some embodiments. It is needless to say that the invention is not limited to or by these embodiments and can be modified without departing from the gist thereof.

The invention can be applied to element isolation for electrically isolating between high breakdown voltage semiconductor elements formed adjacent to each other on an SOI substrate.

What is claimed is:

1. A semiconductor device, comprising:
an SOI substrate having a support substrate, a BOX layer formed over the main surface of the support substrate and made of an insulator, and an active layer formed over the upper surface of the BOX layer;
an LOCOS insulating film formed over the upper surface of the active layer and annularly surrounding an element region in a planar view;
a deep trench annularly surrounding the element region in a planar view, formed continuously in a portion of the LOCOS insulating film and the active layer therebelow, and reaching the BOX layer; and
an insulating film filled in the deep trench,
wherein the trench width of the deep trench formed in the portion of the LOCOS insulating film is smaller than a trench width of the deep trench formed in the active layer,
wherein the insulating film also functions as an interlayer insulating film covering therewith a semiconductor element formed in the element region,
wherein the deep trench defines a hollow portion,
wherein, in a cross-section view, a width of the hollow portion is larger at a lower portion of the deep trench than at an upper portion or a middle portion of the deep trench,
wherein said interlayer insulating film in the deep trench is disposed in direct contact with the active layer, and
wherein the trench width of the deep trench formed in the portion of the LOCOS insulating film is smaller than 1.2 µm.

* * * * *